US008879218B2

(12) United States Patent
Tomimbang

(10) Patent No.: US 8,879,218 B2
(45) Date of Patent: Nov. 4, 2014

(54) ARC FAULT CIRCUIT INTERRUPTER, SYSTEMS, APPARATUS AND METHODS OF DETECTING AND INTERRUPTING ELECTRICAL FAULTS

(75) Inventor: Wendell E. Tomimbang, Kissimmee, FL (US)

(73) Assignee: True-Safe Technologies, Inc., St. Cloud, FL (US)

( * ) Notice: Subject to any disclaimer, the term of this patent is extended or adjusted under 35 U.S.C. 154(b) by 980 days.

(21) Appl. No.: 12/642,737

(22) Filed: Dec. 18, 2009

(65) Prior Publication Data

US 2010/0097733 A1      Apr. 22, 2010

Related U.S. Application Data

(63) Continuation-in-part of application No. 11/956,364, filed on Dec. 14, 2007, now Pat. No. 7,697,248.

(51) Int. Cl.
*H02H 3/00* (2006.01)
*H02H 1/00* (2006.01)
*G01R 31/02* (2006.01)

(52) U.S. Cl.
CPC ............ *H02H 1/0015* (2013.01); *G01R 31/024* (2013.01)
USPC ........................................................... 361/42

(58) Field of Classification Search
None
See application file for complete search history.

(56) References Cited

U.S. PATENT DOCUMENTS

| 6,459,557 | B1 * | 10/2002 | Haensgen et al. ........... 361/93.2 |
| 8,289,664 | B2 * | 10/2012 | Haines et al. .................... 361/42 |
| 8,335,062 | B2 * | 12/2012 | Haines et al. .................... 361/42 |
| 8,405,939 | B2 * | 3/2013 | Haines et al. .................... 361/42 |
| 2003/0146725 | A1 * | 8/2003 | Griesemer et al. ............ 318/434 |
| 2009/0040666 | A1 * | 2/2009 | Elms et al. ....................... 361/42 |
| 2010/0046129 | A1 * | 2/2010 | Mikrut ............................. 361/45 |
| 2011/0216451 | A1 * | 9/2011 | Haines et al. .................... 361/42 |
| 2011/0216452 | A1 * | 9/2011 | Haines et al. .................... 361/42 |
| 2011/0216453 | A1 * | 9/2011 | Haines et al. .................... 361/49 |

* cited by examiner

*Primary Examiner* — Rexford Barnie
*Assistant Examiner* — Angela Brooks
(74) *Attorney, Agent, or Firm* — The Miller Law Offices, PLC; Steven J. Miller, Esq.

(57) ABSTRACT

In all electrical circuits, various arcing conditions can arise, however, the primary ones are series arcing (low current arcing), and, parallel arcing (high current arcing). An arc fault circuit interrupter ("AFCI") that protects for both series and parallel arcing is called a combination type. An AFCI is a device that controls the effects of electrical arcing by opening a circuit through a tripping mechanism that isolates the load from the supply line upon detection of an arcing condition. In this invention, this arc fault is detected by a circuit employing a Hall-Effect sensor ("HES") integrated circuit, and a microprocessor among other components.

36 Claims, 16 Drawing Sheets

FUNCTIONAL BLOCK DIAGRAM OF
AN ARC FAULT CIRCUIT INTERRUPTER

PARTIAL SCHEMATIC OF AFCI CIRCUITRY SHOWING MISWIRE PROTECTION CIRCUIT

ARC FAULT CIRCUIT INTERRUPTER, SYSTEMS, APPARATUS AND METHODS OF DETECTING AND INTERRUPTING ELECTRICAL FAULTS

CROSS REFERENCE TO RELATED APPLICATIONS

This application is a Continuation-In-Part of, and claims priority from, U.S. application Ser. No. 11/956,364.

STATEMENT REGARDING FEDERALLY SPONSORED RESEARCH OR DEVELOPMENT

Not Applicable

DESCRIPTION OF ATTACHED APPENDIX

Not Applicable

BACKGROUND OF THE INVENTION

1. Field of the Invention

The present invention relates to the protection of electrical circuits and to the detection of electrical arcing faults and in addition, optional overload, short circuit, surge and ground fault detection.

2. Arcing is a condition where an intermittent flow of current occurs along or across current-carrying conductors with subsequent discharge of light and heat energy that builds up in time until it burns the wire insulation and ultimately the vicinity to cause fire. Arcing occurs when the electric field between two or more separated conductors reaches the ionization potential of the separating medium which often is a gap between conductors. Arcing is known to be a major cause of electrical fires.

Arc Fault Circuit Interrupters (commonly known as AFCI) mitigate the effects of arcing by detecting arcs and interrupting the power supply to an electric circuit when arcs occur. For the purposes of this disclosure, the term arc (or arcs) when used singly, are those that are considered dangerous which causes electrical fires.

AFCIs could come in different types or forms including receptacle, receptacle outlet, circuit breaker, cord type, portable type, modular or integrated as part of another electrical system, equipment or device. The AFCIs in this disclosure provide circuit protection by detecting arcs and other electrical faults that could include overcurrent or overload, short circuit and with associated hardware and microprocessor code modification could include surge, ground and any other electrical faults, AC (alternating current) or DC (Direct Current), single or multi-phase. This disclosure also include systems, methods and apparatus for the interruption (or isolation) of power supply to electric circuits on the occurrence of said faults.

Prior arts have employed many different methods and techniques for arc fault detection and interruption, in most cases concentrating on a particular condition or type of arc. In reality, there are multiple types of arcs. This disclosure involves AFCIs that protect circuits from series and parallel arcs and they are commonly known as combination type AFCIs.

Series arcs are those that occur along a current-carrying conductor when it is cut or severed but somehow an unstable conductive path still exists. This could either be through incomplete separation of conductors or through carbonization of the gap between them. Loose terminal connections are considered a series arcing condition.

Parallel arcs are those that occur across two current-carrying conductors where an unstable conductive path exists between them. This could be through a carbonized path or metallic object such as a nail accidentally driven between the conductors. This type of arc being across two conductors is typically a high current of intermittent flow, which may in some cases be mistaken as a short circuit condition.

There are some electrical equipment and loads whose signal characteristics (or signatures) mimic those of arcs and some that produce actual arcs in normal operation. These are sometimes called or termed good arcs When an AFCI mistakenly detects a good arc and interrupts power supply to a circuit, this is considered a nuisance tripping condition which also occurs when there is excessive noise in the circuit that the resulting signature mimics that of an arc. The devices, apparatus, methods and systems in this disclosure are intended to limit or eliminate the occurrence of nuisance tripping conditions.

Prior arts have not successfully addressed many challenges in arc fault detection and interruption as reflected by the limited number of AFCI devices currently commercially available, and this opens up opportunities for new developments and improvements in this technology.

U.S. Pat. No. 7,062,388 (Rivers, Jr. et al.) disclosed a frequency harmonic identifier for detecting series arcs on a power line that includes a frequency analyzer for providing the harmonic content of a sensed current signal and a decision logic for comparing a tested signal to at least one reference signal. This also discloses that the frequency analyzer provides a Fast Fourier Transform of the input signal and a band selector for selecting bands of the Fast Fourier transform of the input signal for comparing to at least one reference signal. While embodiments of this invention mentioned about the fundamental to the $3^{rd}$ harmonics, these are used for computative analysis between harmonics, and not by comparison of a tested signal to at least one reference signal as covered by Rivers' patent. The embodiments of this invention does not employ Fast Fourier Transform and a band selector but instead uses coherent Direct Fourier Transform, which is different.

U.S. Pat. No. 7,391,218 (Kojori, et al.) disclosed a method and apparatus to detect series and/or parallel arc faults in AC and DC systems, wherein a fundamental component of the AC current signal is extracted and monitored for amplitude variation as a first arc detection measure, and non-stationary changes in the AC current signal applying at least one measure of order generating a second arc fault detection measure. Anyone experienced in the art of arc detection understands that it requires numerous methods, calculations, and combinations thereof to effectively detect arc faults and eliminate the occurrence of nuisance conditions. While analysis of fundamental component of the AC current signal could indicate the presence of arc fault, it does not cover all the other elements of arcing detection specially with different loads and/or plurality of loads with signals that mimic that of an arcing condition, or a nuisance condition. The embodiments of this invention includes fundamental harmonic but not applied as that of Kojori invention but instead used to obtain a ratio against the other harmonics, as one of the conditions in arc fault detection. This is only one of plurality of methods used in the detection of arc faults employed in this disclosure.

U.S. Pat. No. 6,876,528 (Macbeth et al.) disclosed a fault detector sensor includes a current transformer, with two multi-turn windings each formed around a portion of the core, with one winding adjacent to each of the hot and neutral wires of the power line being protected. Both windings are connected in series in a way which reinforces arc fault noise generated by arc faults involving the line and neutral, but which causes signal reduction for noise signals from the line and neutral, or either, to ground. The windings and core are selected to self resonate at a frequency that excludes power line carrier frequencies but which includes arc fault frequencies. The core optionally has a third winding, forming a grounded neutral transformer, or ground fault detector. Instead of a third winding, one of the arc fault sensing windings can act as a dual function sensor. This patent discloses the use of the current transformer as the sensing element used in most prior arts or electrical fault detection. Prior arts mentioned the same current transformer as Hall sensor, current sensor, 2 resonant circuit, clamp and other names, but all are different to the HES (1) in this invention.

U.S. Pat. No. 6,751,528 (Dougherty et al.) disclosed an electronically controlled circuit breaker comprising: a line current sensor sensing line current signals; a processor for determining the fundamental frequency of the current signals, wherein the processor processes a preselected number of multiples of the fundamental frequency, and squares and sums the multiples to yield even, odd, and fundamental values; even, odd, and fundamental bins within the processor for receiving the even, odd, and fundamental values, wherein the processor processes even arc signals and non-harmonic arc signals from the even, odd, and fundamental values in the bins; and, an expert arc algorithm within the processor having an accumulator for calculating an incremental value based on even arc signal and non-harmonic arc signal input, and additionally wherein the processor applies an acceleration factor to the incremental value when both an even arc threshold and a non-harmonic arc threshold are exceeded by the even arc signal and the non-harmonic arc signal, respectively, and a fixed threshold for which to compare the incremental value; wherein the processor issues a trip signal when the fixed threshold is exceeded by the incremental value. Unlike the embodiments of this invention which calculates its relationship with the $2^{nd}$ and $3^{rd}$ harmonics, the Dougherty patent relies on the multiples, squares and sums of the fundamental frequency to yield even, odd and fundamental values. Anyone experienced in the art of arc detection understands that it requires numerous methods, calculations, and combinations thereof to effectively detect arc faults and eliminate the occurrence of nuisance conditions. While analysis of fundamental frequency could indicate the presence of arc fault, it does not cover all the other elements of arcing detection specially with different loads and/or plurality of loads with signals that mimic that of an arcing condition, or a nuisance condition.

U.S. Pat. No. 7,440,245 (Miller et al.) disclosed a method of detecting an arc fault in a power circuit, said method comprising: determining a peak amplitude of a current pulse of a current flowing in said power circuit; determining whether the peak amplitude of said current pulse is greater than a predetermined magnitude; responsively employing at least one algorithm and said peak amplitude to determine whether an arc fault condition exists in said power circuit; determining that said current pulse has said peak amplitude of greater than said predetermined magnitude and responsively activating said at least one algorithm from said inactive state; employing a plurality of half-cycles of said current flowing in said power circuit including a present half-cycle and a previous half-cycle; and employing as one of said at least one algorithms: determining the peak amplitude of said current pulse for the present half-cycle and the previous half-cycle, determining that the peak amplitude of said current pulse for the previous half-cycle is greater than about zero and responsively adding an amount equivalent to an increase in said peak amplitude from the previous half cycle to the present half-cycle to an accumulator, and otherwise, adding an amount equivalent to said peak amplitude of said present half-cycle to said accumulator, decaying the amount stored in said accumulator over time, and determining an arc fault condition in said power circuit if the amount stored in said accumulator exceeds a predetermined value. Anyone experienced in the art of arc detection understands that it requires numerous methods, calculations, and combinations thereof to effectively detect arc faults and eliminate the occurrence of nuisance conditions.

U.S. Pat. No. 7,295,415 (Huang et al.) An end-of-service-life integrated circuit chip (IC2) capable of performing an end-of-service-life test in a circuit interrupting device, said IC2 comprising: a flip-flop latch circuit comprises a first transistor and a second transistor; wherein said flip-flop latch circuit is adapted to receive and transmit a status signal when said circuit interrupting device is powered on and at a tripped state, allow said circuit interrupting device to be reset when components in a main circuit of said circuit interrupting device function normally, and disallow said circuit interrupting device to be reset when at least one of said components in said main circuit of said circuit interrupting device do not function properly; and an emitter circuit comprising a third transistor; wherein said emitter circuit is adapted to output said status signal from said flip-flop latch circuit through said third transistor to a simulated leakage current generation circuit of said circuit interrupting device to generate a simulated leakage current to test whether said components in said main circuit of said circuit interrupting device function normally; and wherein said IC2 performs said end-of-service-life test without a depression of a reset button in said circuit interrupting device. This patent refers more to an analog determination which is completely different from the methods in this disclosure which employs a combination of hardware and code routines.

U.S. Pat. No. 7,295,410 (Packard et al.) Protective device with miswire protection is disclosed in this invention, however, the art is applied on wiring devices using a solenoid actuator operated tripping mechanism with a manual reset mechanism. Unlike this invention which uses a uP controlled operation associated with the detection circuitry which uses separate solenoid actuators for both the tripping and reset mechanisms. This patent also refers more to an analog determination which is completely different from the methods in this disclosure which employs a combination of hardware and code routines.

The methods of fault detection and interruption in this disclosure include a combination of hardware and software systems and apparatus to have a reliable arc fault circuit interrupter using commercially available and low-cost microprocessors.

BRIEF SUMMARY OF THE INVENTION

In all electrical circuits, various arcing conditions can arise, however, there are mainly two: Series arcing (or low current arcing), and, parallel arcing (or high current arcing). An AFCI that protects for both series and parallel arcing is called a combination type. The methods of fault detection and interruption in this disclosure include a combination of hardware and software systems and apparatus to have a reliable arc fault circuit interrupter using commercially available and low-cost microprocessors. The instant invention comprises electrical devices commonly known as Arc Fault Circuit Interrupters (or AFCI), circuitry, systems, apparatus and methods for detecting arcs, overcurrent or overload, short circuit, and other electrical faults in AC (alternating current) single and multi-phase phase circuits; said devices, circuitry, systems, apparatus and methods of for detecting arcs, overcurrent or overload, short circuit, and other electrical faults in DC (direct current) circuits; said devices, circuitry, systems, apparatus and methods for interrupting the circuit (or power supply) on occurrence of arc, overcurrent or overload, short circuit, and other electrical faults in AC single and multi-phase, and DC circuits; said devices exist in different types or forms including receptacle, receptacle outlet, circuit breaker, cord type, modular or integrated as part of another electrical system, equipment or device; said devices, circuitry, systems, apparatus and methods optionally combining features which include detection of ground and surge faults in AC single or multi-phase circuits, with associated hardware and microprocessor code re-configuration; said devices are combination type AFCIs or those that detect series and parallel arcs, and interrupt the circuit on occurrence of said faults; said devices, circuitry, systems, apparatus and methods limit or eliminate the occurrence of nuisance tripping from excessive noise in the circuit or from normal operating signals from different electrical equipment or loads that mimic the signature of an arc; said devices, circuitry, systems, apparatus and methods limit or eliminate the occurrence of nuisance tripping by set code parameters and thresholds that distinguish them from arcs; said device comprising of a housing, circuitry, line and load side terminals; Hall Effect Current Sensor; power supply or automatic power switcher circuit; anti alias filter; programmable gain amplifier; buffer amplifier; microprocessor; reset and test (or trip) buttons; electromagnetic contactor; contactor position switching circuit; visual indicators; audible alarms; and the associated mechanical, electrical, electro-mechanical and electronic components and interconnections; said devices comprising a housing, line and load terminals, contacts and the associated mechanical, electrical, electro-mechanical, electro-optical and electronic components and interconnections, designed and constructed according to the types or forms; said devices, which in the form of circuit breaker (or circuit breaker type), the reset button may be replaced by a reset handle or lever. Said methods and systems for detecting and interrupting arcs comprise a combination of hardware and software systems; said Hall Effect Current Sensor comprising of the following elements: a Hall current drive; dynamic offset cancellation; gain and temperature coefficient adjustment; amplifiers; zero "0" current adjustment, analog and digital outputs; analog to digital converter; said Hall Effect Current Sensor, its circuitry and elements as applied to the said devices, circuitry, systems, apparatus and methods; said Hall Effect Current Sensor where any of its elements may become external part thereof, maintaining the same principle of operation and properties as applied to the devices; said Hall Effect Current Sensor which is power-driven and bi-directional; said Hall Effect Current Sensor with its output voltages being proportional to the current flow; said Hall Effect Current Sensor with stable output offset voltage, nearly zero magnetic hysteresis; and ratiometric output from supply voltage; said Hall Effect Current Sensor may be configured with additional circuit for detection of zero crossing, over-current or overload and other additional features that could be used for signaling and detection of arcs with other electrical faults. The use of integrated Hall Effect Current Sensor being the commercially available component from the family of "Allegro MicroSystems, Inc." Hall Effect Current Sensors Models ACS712 or ACS710, and variants thereof, as applicable to the devices, circuitry, systems, apparatus and methods herein. The use of integrated Hall Effect Current Sensor, and the type, form, properties, characteristics or specifications of the said Hall Effect Current Sensor from any sources other than "Allegro MicroSystems, Inc.", for use on arc fault detection and interruption and said devices, circuitry, systems, apparatus and methods herein; said Hall Effect Current Sensor are further selected according to the current ratings of the devices herein; said Hall Effect Current Sensor is distinct from the current transformers used as current sensors of prior arts of electrical fault detection; the output signals of said Hall Effect Current Sensor are conditioned for analysis and processing for detection of electrical faults; said Automatic Power Switcher circuit comprising of an input rectifier and filter, inverter/chopper and controller, high frequency transformer, output rectifier and filter, along with the necessary components and interconnections; said Automatic Power Switcher circuit being a Switch Mode Power Supply circuit as applicable to the devices, circuitry, systems, apparatus and methods herein; said Automatic Power Switcher circuit being distinct from any other power supply sources used in similar devices as described herein; said Automatic Power Switcher circuit employing a high frequency transformer and power switcher Integrated Circuit which automatically adopts to the input voltage from a given range of 80-265 VAC (or any other applicable voltage range as specific designs may call for) to provide constant DC voltage output or multiple outputs to the power driven components of the devices as described herein; said Automatic Power Switcher circuit allowing the same detection and interruption circuitry of the devices to be used commonly for 110V, 220V or any other voltage within its operating range 80-265 VAC (or any other applicable voltage range as specific designs may call for); said Automatic Power Switcher circuit that minimizes internal heating in enclosed circuits such as the devices as described herein with the use of high frequency transformers and microelectronic circuitry avoiding unnecessary conditioning systems and components; said Automatic Power Switcher circuit which provides stable DC output voltage to the devices described herein regardless of fluctuations in the input voltage within the input voltage range of the device 80-265 VAC (or any other applicable voltage range as specific designs may call for); said Automatic Power Switcher circuit which operates independently of the type of power source and is applicable for all configurations within the operating voltage range, i.e., Line-to-Line, Line-Neutral, with the same constant output DC voltage; said Automatic Power Switcher circuit with the associated hardware and software program as an integral part of and the workings of the devices, circuitry, systems, apparatus and methods described herein. The devices described herein may use other alternatives in lieu of the said Automatic Power Switcher circuit to supply its various DC power driven components. The application and operation of the Programmable Gain Amplifier (PGA) as used in the devices, circuitry, systems, apparatus and methods as described herein. The Programmable Gain Amplifier (PGA) as used to maintain the signal amplitude of the output signal of the Hall Effect Current Sensor described herein within a range suitable for Analog to Digital Conversion, as used in the detection of arc and other electrical faults. With the Programmable Gain Amplifer (PGA), connecting the low input to the low output and both to the dc offset voltage allows the AC component of the output signal from the Hall Effect Current Sensor to be amplified with variable gain while the DC component receives a constant gain; said Programmable Gain Amplifier (PGA) is Analog Devices, Inc.'s AD8231 as applicable to the devices, circuitry, systems, apparatus and methods described herein; said Programmable Gain Amplifier (PGA) which is a low-drift digitally programmable instrumentation amplifier with programmable gains. The use of a PGA, the type, form, properties, characteristics or specifications as the said Programmable Gain Amplifier (PGA) from any sources other than "Analog Devices, Inc.", as applicable to the devices, circuitry, systems, apparatus and methods described herein. The peripherals, configuration, applications and operation of the microprocessor described above to meet the requirements of the devices, circuitry, systems, apparatus and methods described herein; said microprocessor being from the 80C51 (also popularly known as 8051) 8-bit family of microcontrollers/microprocessors particularly the NXP P89LPC935 or P89LPC936, as used with the devices, circuitry, systems, apparatus and methods described herein; said microprocessors could alternatively be substituted by NXP P89LPC9351 or P89LPC9361 which have similar peripherals as the NXP P89LPC935 or P89LPC936 with expanded capabilities, once the development tools become available. The selection of the microprocessors for their peripherals and machine operating speed to meet the sampling requirements of arc fault detection for the devices described herein. The configuration of a set of peripherals of said microprocessor to perform sampling to support coherent DFTs (Direct Fourier Transforms) and use their properties to compute and detect arc then disengage the contacts between the line and load side of the devices described herein when an arc is present. The configuration of a set of peripherals of said microprocessor to generate the timing signal required for coherent sampling of DFTs described herein. The use of microprocessors of the same peripherals, type, form, properties, characteristics and specifications as the microprocessors above, as applicable to the devices, circuitry, systems, apparatus and methods described herein, from sources other than NXP; said devices, consisting of audible indicator; and visual indicators such as light emitting diodes (LED) or liquid crystal display (LCD) of any number, which could among other things indicate functional conditions such as power on and fault conditions as arc, overload, short circuit, miswire, end-of-life, and others; said audible indicator which could operate alone or in association with the visual indicators to indicate functional conditions; said audible indicator which could be a buzz, bell or any sound of continuous or intermittent nature to indicate functional conditions; said audible indicator which could be single or multiple in number, operating alone or in association with other audible and visual indicators to indicate functional conditions; said visual indicators which could operate alone or in association with the audible and other visual indicator to indicate functional conditions; said visual indicators which could be of different designated colors according to the different functional conditions; said visual indicators which could operate in steady, blinking or timed manner to indicate functional conditions; said devices provided with miswire protection circuitry. The miswire code description and the miswire circuitry above, said miswire protection circuitry satisfies the requirements for miswire protection by the applicable UL standards for the devices described herein; said miswire protection also applies to Ground Fault Circuit Interrupters (GFCI) and similar electrical fault protective devices, as well as electrical systems for other applications requiring such protection. When miswire condition occurs, the microprocessor activates the tripping mechanism to interrupt the circuit; said miswire protection circuitry consisting of 2 similar bridge circuits on line and load sides of the devices described herein with common connection to the automatic power switcher circuitry above; said miswire protection circuitry allowing reversibility of connections to load and line in the devices described herein with code modification. The determination or measurement of contactor position for miswire condition herein is done after the peak of the AC line sine wave where at that point, the contactor position has changed and signal voltage on the load side is either existent or not according to the switched position. The same miswire circuitry will apply to the devices described herein on electrical systems with fundamental frequency of 60 Hz as well as other than 60 Hz, with code modification to adjust hardware timing to the new frequency. The hardware timing is set up for automatic response to line frequency changes. The provision of visual and/or audible indicator/s to indicate the occurrence of miswire condition on the devices described herein; said device employing an electromagnetic contactor with trip and reset mechanism using two separate solenoid actuators that are driven by triacs which are switched by optically-coupled triacs (or optocouplers); said electromagnetic contactor being connected to the AC supply line of the devices described herein; said solenoid actuators activated by coils designed for use on AC supply, but could alternatively be designed for use on DC supply as necessary with corresponding hardware changes on the devices described herein; said Test and reset mechanism hold functions when the buttons are depressed, and start code routines after they are released; said test button when depressed, holds the execution of code until it is released, then the code routine sets an ARC Declare flag that determines if the trip mechanism is activated on the next positive slope zero crossing.

As an option for the devices herein, on operation of Test button, an arc value above the arc threshold is introduced into the data processing routine, enters the infinite loop, becomes interpreted as an arc and thereby go through the DECLAREARC routine to trip the contactor and isolate the line from the load side of the devices herein.

Declare Arc flag is set upon decoding the switch and cannot be cleared by anything other than the reset switch; said tripping mechanism is activated upon the detection of fault condition; said tripping mechanism is also activated upon the detection of miswire condition; said tripping mechanism is also activated upon the detection of end-of-life condition, if the device is capable of tripping. Reset function is inactive on end-of-life conditions or failures; said devices with modified code, may alternatively be equipped with a solenoid-activated tripping mechanism and manual reset with hardware modification; said devices with modified code, may alternatively be equipped with an electromagnetic contactor with single-coil, linear motion, reversible solenoid actuator with the necessary hardware for the test and reset mechanisms; said devices with modified code, equipped with an alternative electromagnetic contactor with trip and reset mechanism using single coil solenoid actuator as illustrated in FIGS. 6, 7 and 8; said alternative electromagnetic contactor which is adoptable to either push or pull motion actuator depending on the actual configuration of the stationary and movable contact assemblies for the line and load connections to the devices described herein; said alternative electromagnetic contactor equipped with a mechanical locking and displacement assembly which serves as the test and reset mechanism for the devices described herein; said alternative electromagnetic contactor equipped with movable contact assemblies described herein positioned directly opposite the stationary contact assemblies; said alternative electromagnetic contactor using single motion actuator that alternates locking positions between the lower and upper locks corresponding to the test and reset positions of the electrical contacts, or the engaged and disengaged positions of the electromagnetic contactor; said alternative electromagnetic contactor which could be operated by AC or DC power supply according to the design of the actuator coil; said devices described herein, provided with means of determining end-of-life conditions and interrupting the circuit on the occurrence of such conditions. End-of-life means a condition where the devices described herein are no longer able to perform the functions they are designed for, nor is it safe to continue using them, where such failures may either be a hardware or software issue or both; said end-of-life determination made through a series of code routines and hardware test points on the devices described herein. One of the conditions to determine end-of-life of the devices described herein is through a pre-set time period, say 5 years of cumulative operation time, which is arbitrary to the manufacturer, and/or as may be required by technical standards or regulatory bodies. One other condition to determine end-of-life of the device of is failure of the reset mechanism to engage. One other condition to determine end-of-life of the devices herein is failure of the test mechanism to disengage; said end-of-life determination attained through code routines conducting series of test and reset operations to test the ability of these mechanisms to disengage and engage contacts between the line and load. The end-of-life is declared after the reset button is released and no longer able to reset the contacts of the devices described herein. The end-of-life is declared after the test button is released and no longer able to disengage the contacts of the devices described herein. When any of the end-of-life conditions is flagged, the visual indicator/s (LEDs) lights up to indicate the failure, where the light indication could be steady, blinking or other patterns. When any of the end-of-life conditions is flagged, an audible indicator activates to indicate the failure. The sound could be steady, intermittent or any pattern, singly or in association with the visual indicator/s; said indicators of including "Power On" which is typically a green steady LED light or any other mode; said indicators including "Miswire" which is the same as the Red Fault indicator except that it is of blinking pattern. The Miswire indicator could optionally be any designated color if required to be a separate indicator. The Miswire indicator could optionally be combined with an audible signal of either continuous, intermittent or in intervals; said indicators including "Fault" indication which is characterized by the steady RED light. Optionally this Fault indicator could be combined with an audible signal of continuous or intermittent pattern, said "Fault" indicator of indicates that an arc, overload or overcurrent, short circuit, or other fault condition is detected; said fault indicator could optionally be a multiple number of lights to individually indicate the different faults that are detected by the devices herein that includes but not limited to arc, overload or overcurrent, short circuit and other electrical faults; said indicators includes End-Of-Life indication which is characterized by the blinking RED light which is the same as the Fault Indicator light, except that it is in blinking pattern; said indicator could optionally be combined with an audible signal of either continuous or intermittent pattern; said indicators could operate individually, or for multiple functions and patterns which is discretionary to the manufacturers of the devices described herein. Among multiple methods and systems of measurement and calculation of Arcs used in this disclosure is as based on the ratio of the $3^{rd}$ and fundamental harmonic amplitudes. Said method and system of measurement of arc using the formula: Arc=1000× (Amplitude of $3^{rd}$ Harmonic/Amplitude of the Fundamental Harmonic), where 1000 is an arbitrary number which could be varied to match the AFCI code and testing parameters as well as the capabilities of development apparatus; said calculation set a basis for establishing arc threshold values, computations and defaults used in the code. All calculations are programmed with the measured line frequency to allow operation on a range of line frequencies or with less stable oscillators. Using the same method of calculations for the devices described herein could be operated by a modified code based on 50 Hz fundamental, where applicable; said threshold values of arc sets or clears the flag Declare Arc, wherein it is set when Arc is greater than Arc threshold, and it is cleared when Arc is lesser than Arc threshold; said Arc Threshold as a level set by observation of arcs to determine those that are sufficiently large to warrant tripping of the AFCI. Synchronization of sampling to the AC line voltage as the basis for all AFCI operations. The use of Coherent DFT as a method of processing sampled data in the detection of arcs as used in the devices and systems, Coherent DFT being a processing method that fits an eight-bit microprocessor and its peripherals; said processing as accomplished with an analog to digital converter (ADC) which is a peripheral of said microprocessors herein. The processing method using Coherent DFT making possible the use of the low-cost, small-sized microprocessors with the peripherals and speed requirements to perform electrical faults detection. The use of a 4-pole Butterworth filter to prevent aliasing of sampled data and to remove noise in the signal. The code and all its routines in the operation of the AFCI. The code routines as established in the process flow diagrams in the embodiments, these routines may be in alternate orders to satisfy the requirements of the devices, without departing from the principles of this disclosure. Method of Sampling data being limited to only few harmonics—the DC ($0^{th}$ harmonic), the fundamental ($1^{st}$ harmonic), $2^{nd}$ and $3^{rd}$ harmonics; said sampling method making possible the use of low-cost microprocessors like those of this instant invention instead of various FFT or fast computing techniques. The peripherals and specifications being used as basis for selection of the microprocessors herein including but not limited to their internal multi-channel analog to digital converter (ADC), analog comparators (AnC), Capture/Compare Unit (CCU), Input & Output (I/O) options, 167 nsec machine cycle, and their $I^2C$, as applicable to the said devices described herein; said ADC sampling both Line Current and Line Voltage signals. A resistive divider as used to attenuate and DC shift the line voltage at the output of the Hall Effect Current Sensor to match the input limits of the buffer amplifier that provides the reference signal to the Analog Comparator; said signal as combined with the Analog Comparator output to provide positive feedback hysteresis increases the slope of the reference at the instant of switching to produce a more accurate synchronization of sampling to the AC line voltage, as used in the devices described herein. The variable threshold provided by the Digital to Analog converter (DAC) for the Analog comparator (AnC) reference and capacitive elements added to the resistive divider compensates for the phase shift between the voltage signal to the Analog Comparator (AnC) and the current signal to the ADC. The DAC reference signal with the high signal limit of 3.3V, being the power supply voltage of the microprocessor is adjusted to compensate for phase shifts in the current measurement channel, which gives an interrupt on the AC line zero crossing. The Analog Comparator (AnC) Interrupt Service Routine (ISR) differentiates between positive and negative slope zero crossings. The main function is synchronized to the AC Line positive slope zero crossing provided by a global variable which is set in the ISR to signal the main routine when this occurs. The Analog Comparator ISR drives the contactor solenoid actuator switches when the appropriate flag is set to ensure switching occurs at zero voltage, enhancing the life of the contactors. The Flags for contactor actuator solenoid switching are set when an arc is declared or after the Reset switch is depressed. The Test switch declares an arc after it is depressed.

The AFCI code which operates the devices described herein and its routines include but are not limited to:
a) Synchronization of sampling to AC Line Voltage
b) Contactor solenoid actuator switching
c) Use of Precomputed basis functions
c) Synchronization of Infinite loop as the C program main function, to AC Line Voltage by waiting to start each pass.
d) A time shared two pass body of the main function that provides sampling and initial DFT computation on the first pass and final DFT computation, Gain adjustment, and arc evaluation on the second pass.
e) ComputeArc
f) ComputeArcContinued
g) Miswire
h) End-Of-Life
i) Solenoid failure to constitute End-of-Life
j) AdjustGain
k) Contactor Switching Code routines may be modified to meet particular AFCI functional requirements without departing from the basic methods, systems and principles of this disclosure. All Test and Reset functions are contingent on power supply to the devices described herein being connected. Any single, multiple or all of the electronic components and integrated circuits of the devices described herein may be integrated as one or multiple components as Application Specific Integrated Circuits (ASIC) that employs the same methods, principles and techniques of this disclosure to satisfy and meet the requirements of the AFCI.

As an option, on operation of Test button, an arc value above the arc threshold is introduced into the data processing routine, enters the infinite loop, becomes interpreted as an arc and thereby go through the DECLAREARC routine to trip the contactor and isolate the line from the load side of the AFCI.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention.

In the drawings:

FIG. 12 is a process flow diagram of

DETAILED DESCRIPTION OF THE EMBODIMENTS

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
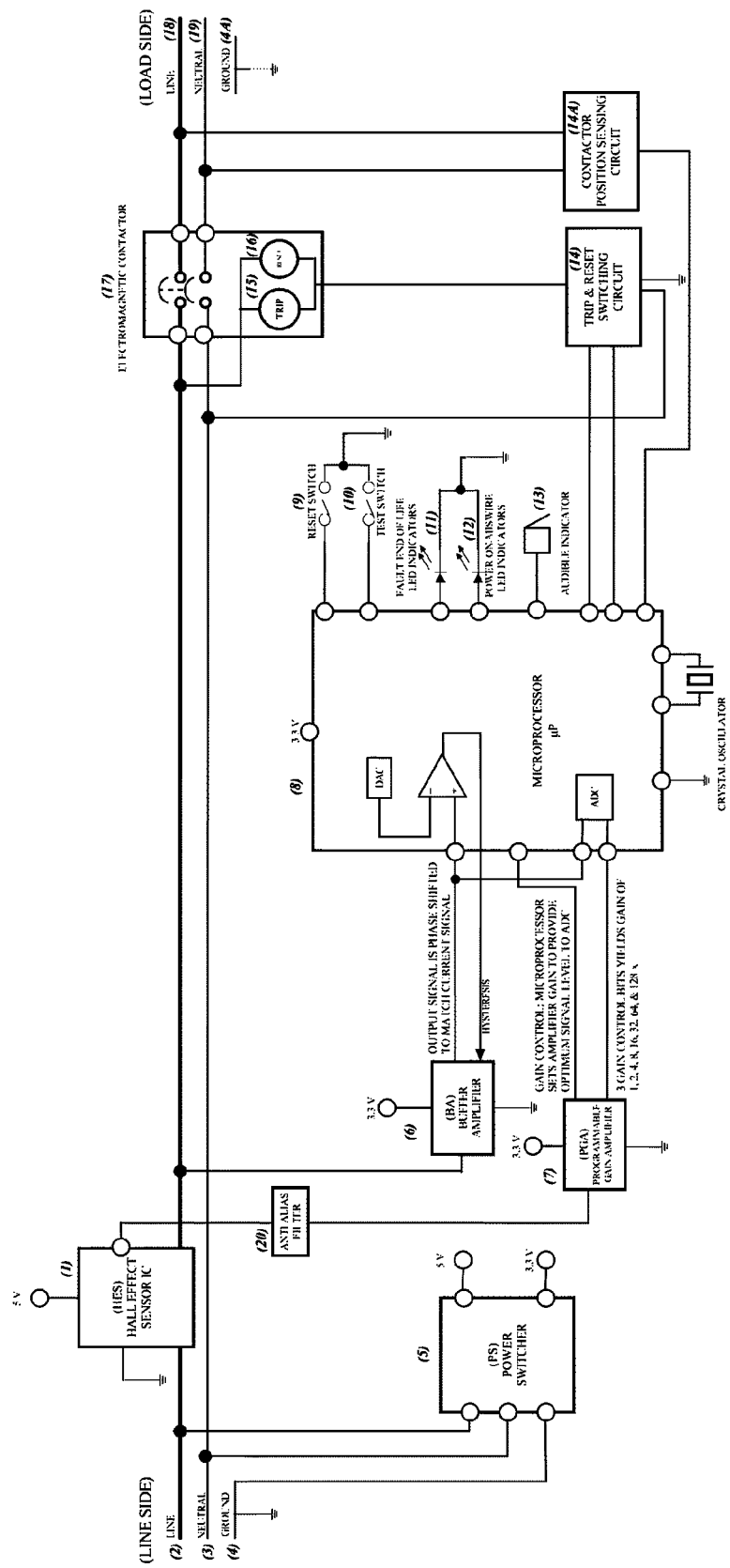
FIG. 1 is a functional block diagram of an arc fault circuit interrupter.

1) FIG. 1 is a functional block diagram of the Arc Fault Circuit Interrupter, hereinafter called AFCI or the device, in accordance with the embodiments of this disclosure. It is composed of a Hall Effect Current Sensor integrated circuit (IC), hereinafter called HES (1); a power supply circuit or automatic power switcher, hereinafter called PS (5) that is connected to the power source (2)/(3)/(4) or line side of the device; an anti alias filter, hereinafter called AAF (20); a programmable gain amplifier IC, hereinafter called PGA (7); a buffer amplifier IC hereinafter called BA (6); a microprocessor, hereinafter called uP (8); buttons for resetting and tripping the device (9)/(10); trip and reset switching circuit (14); electromagnetic contactor (17) which is composed of the trip and reset electrical solenoid actuators (15)/(16) and contacts; contactor position sensing circuit (14A); visual indicators (11), (12); audible indicator (13); and the electrical, mechanical, electro-mechanical and electronic components and interconnections.

BA (6) is for attenuation and offset of the HES (1) voltage output.

Visual indicators (11), (12) such as light emitting diodes (LED) or LCD Liquid Crystal Display) of any number, could among other things indicate the functional conditions of the device such as power on, fault conditions as arc, overload or overcurrent, short circuit, miswire, end-of-life, surge, ground and any other conditions and functions. For the purposes of this disclosure and when it relates to the test button, the terms "trip" or "tripping" means the same as "test" or "testing", as applicable.

In the case of circuit breaker type, the button for resetting the device may be replaced by a reset handle or lever.

The AFCI provides circuit protection from arc, overload or overcurrent, short circuit, and with code and hardware modifications, could include protection for ground, surge, and other electrical faults AC or DC, single or multi-phase.

The AFCI is of the combination type which affords circuit protection from series and parallel arc faults.

The AFCI limits or eliminates the occurrence of nuisance tripping from electrical equipment and loads connected to the circuit with arc-mimicking signatures and those from excessive noise in the power line signal.

All device operations are controlled by the microprocessor uP (8) with all the peripherals and interfaces to process signals received from the HES (1) and the power line. The uP (8) performs comparisons with preset or default conditions and thresholds to detect faults and interrupt the circuit on the occurrence of said faults. Operation of the trip and reset circuit and mechanisms (14)/(15)/(16) are controlled by uP (8). The trip and reset mechanisms consist of separate solenoid actuators that are driven by triacs which are switched by optically-coupled triacs (optocouplers).

Figure 5:
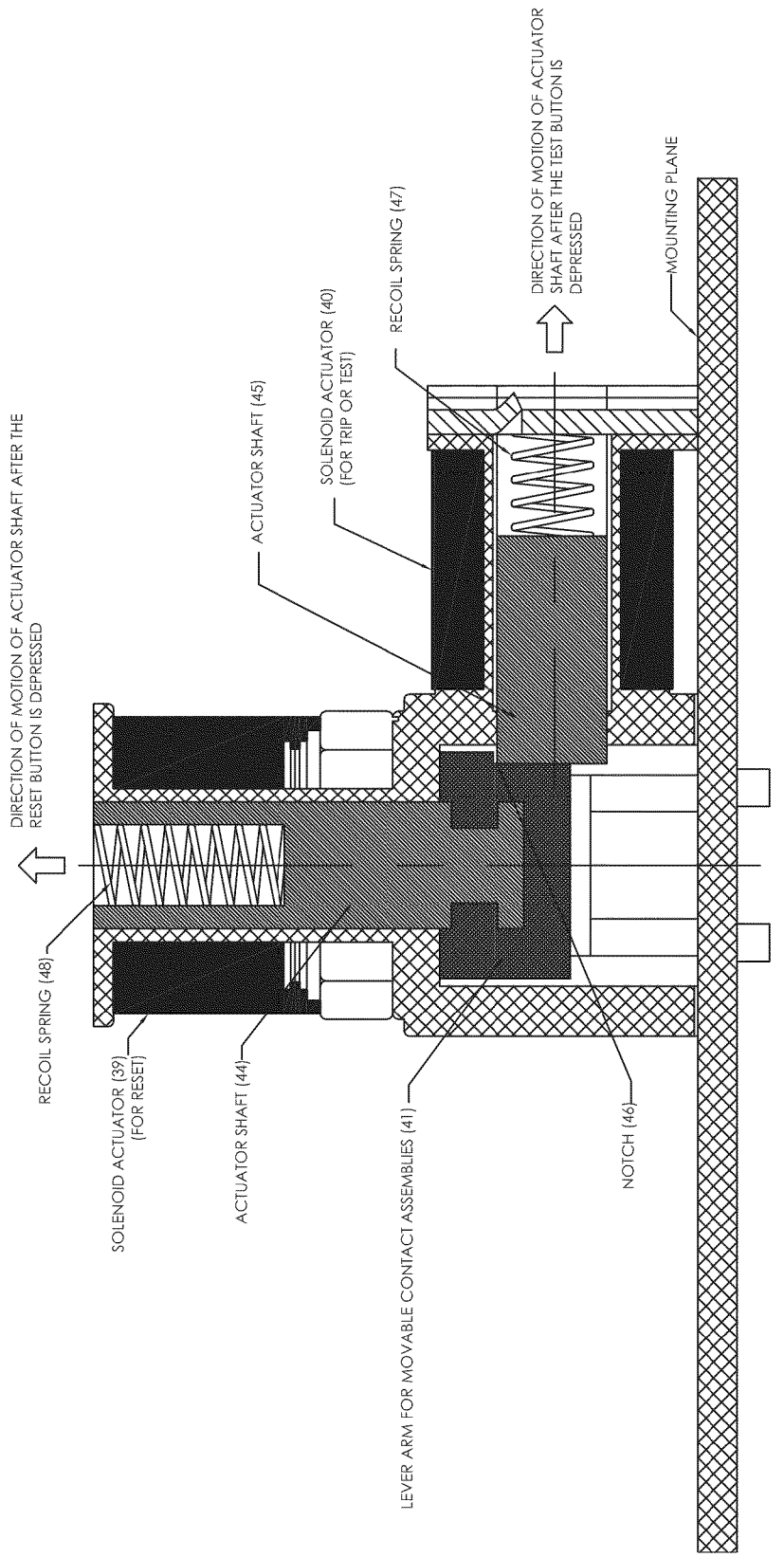
FIG. 5 is a cross-sectional view of electromagnetic contactor with trip and reset mechanism.
Figure 6:
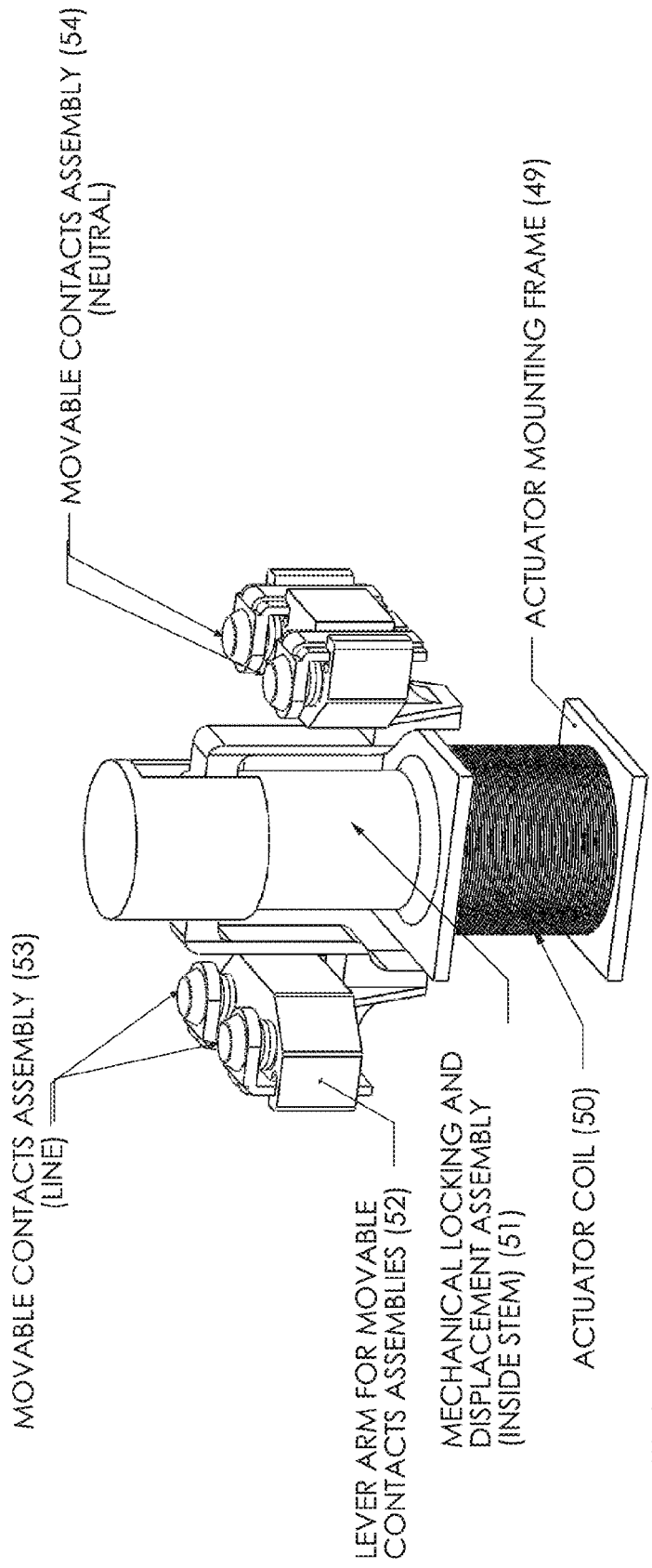
FIG. 6 is a perspective view of an alternate electromagnetic contactor.
Figure 7:
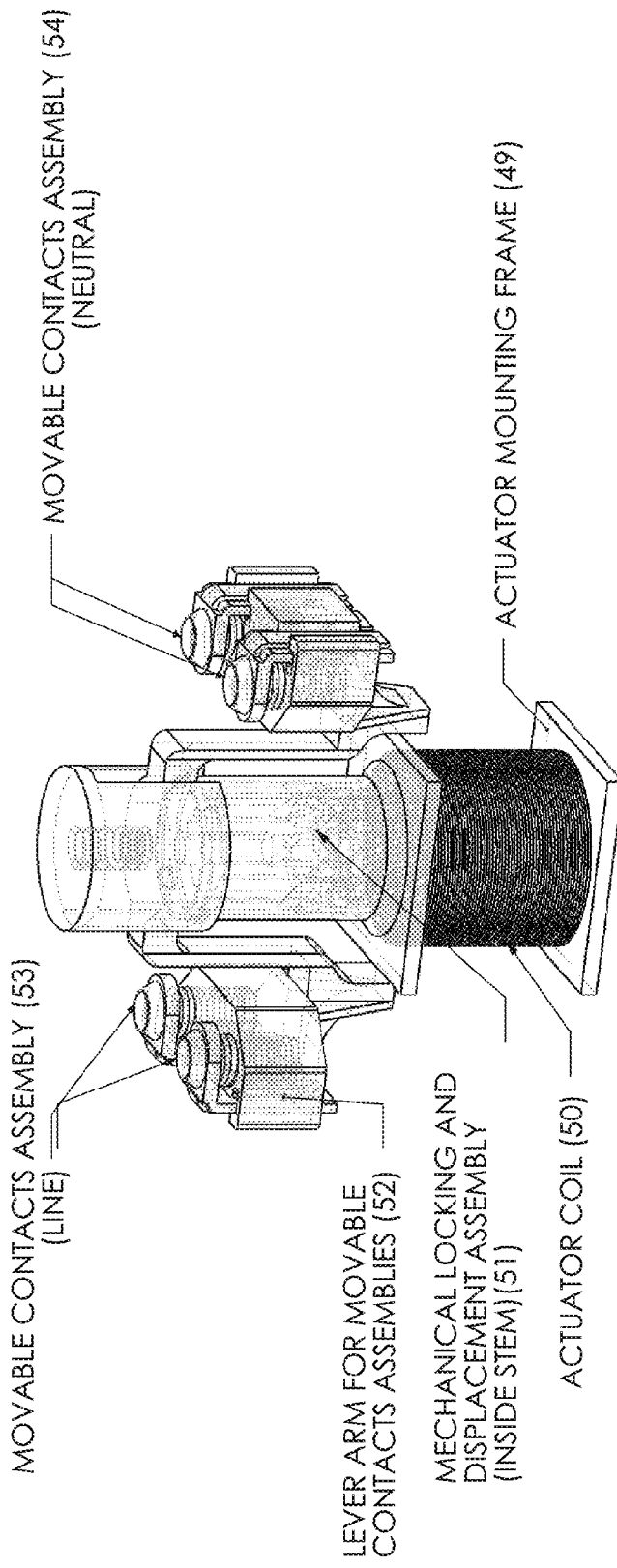
FIG. 7 is a perspective view of an alternate magnetic contactor with trip and reset mechanism.
Figure 8:
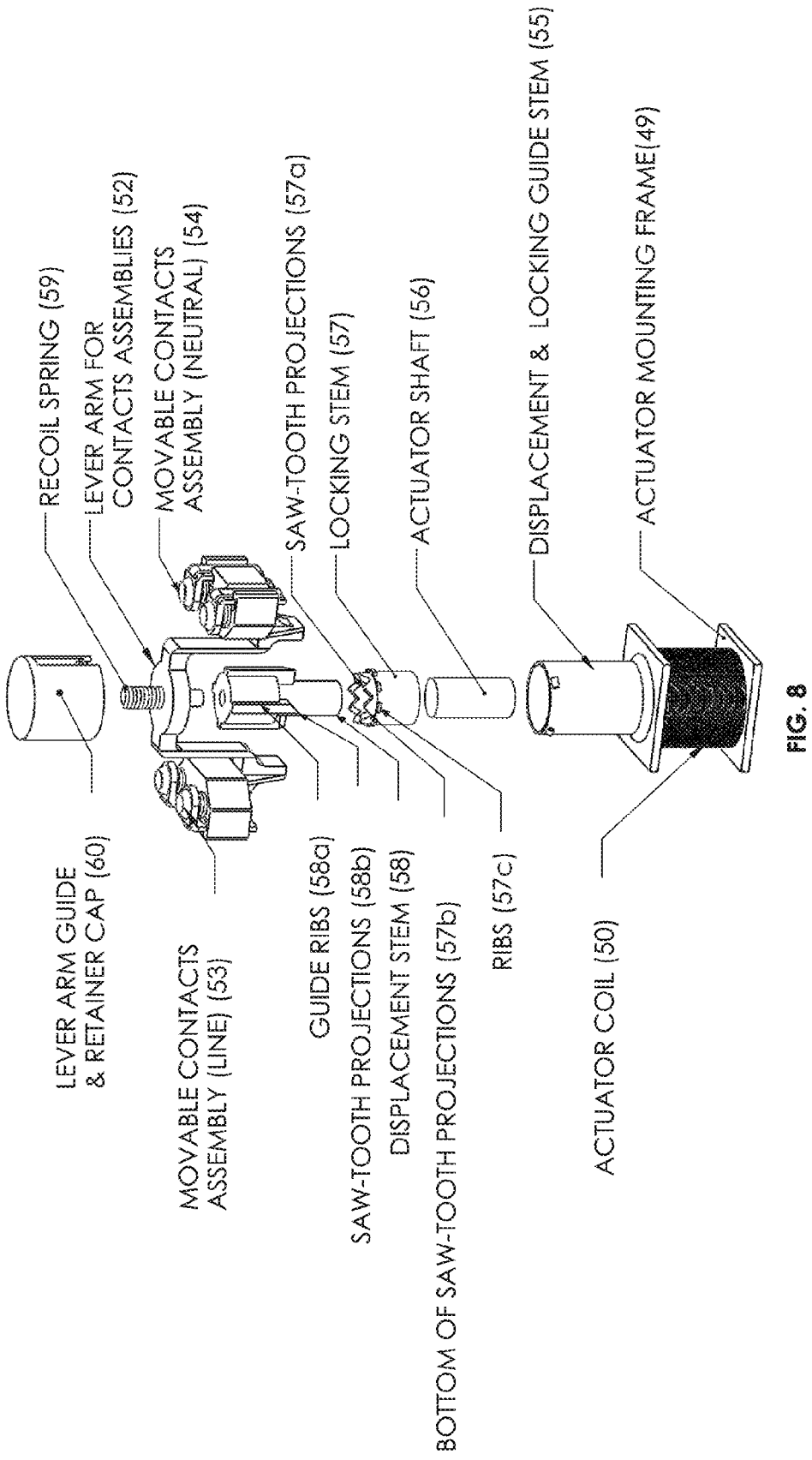
FIG. 8 is an expanded view of alternate electromagnetic contactor.
Figure 9:
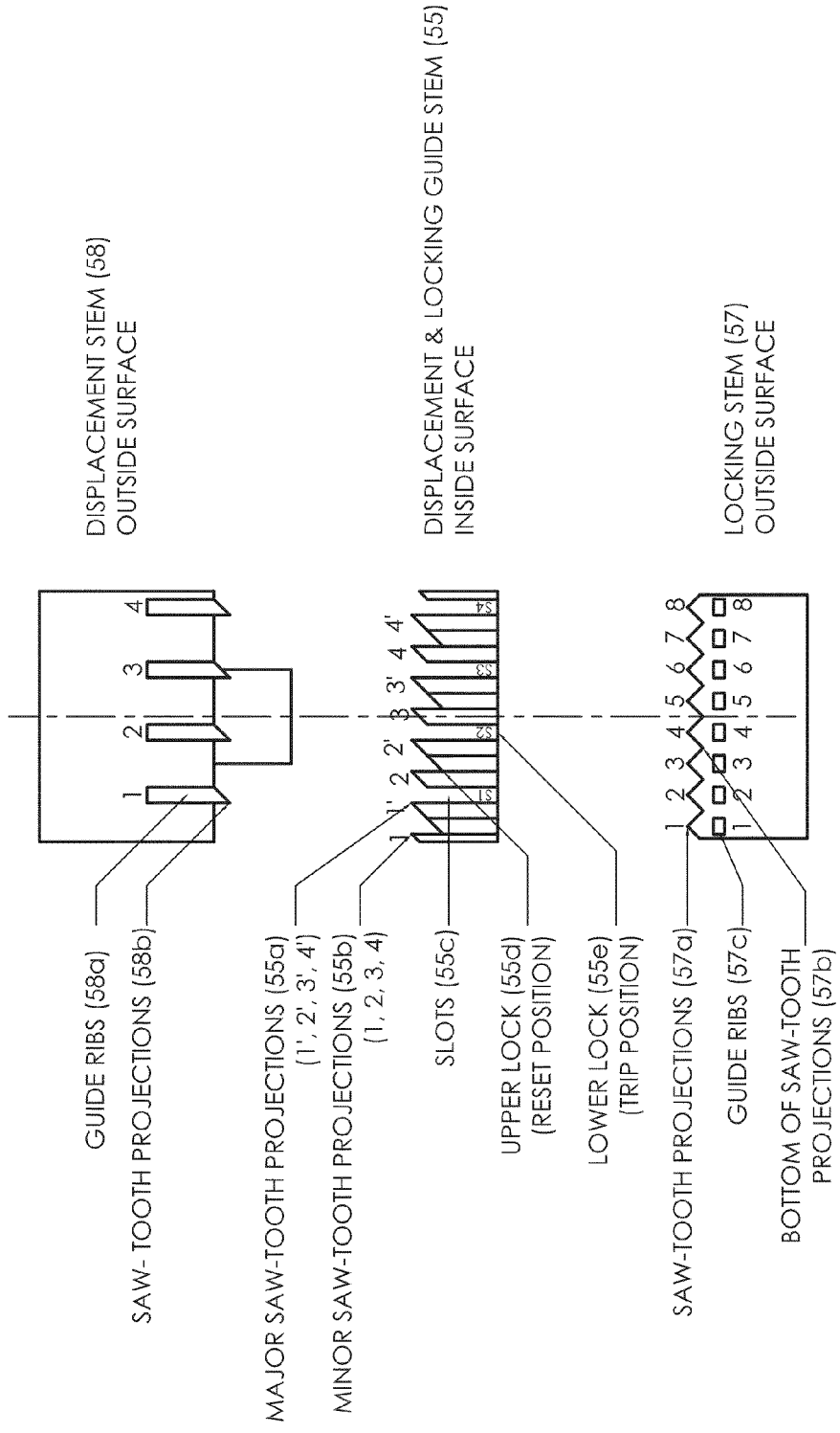
FIG. 9 is a plan view of mechanical locking mechanism of electromagnetic contactor.

Trip Mechanism (15)—Refer to FIGS. 5 & 6. This is driven by a separate solenoid actuator (40) which is actuated after the test button is depressed, and when a fault is detected. This trip mechanism (15) releases the latch that holds the reset mechanism to open the electrical contacts that connects the line with the load side of the device. The contacts remain in open position until the next operation and after the reset button is depressed.

Reset Mechanism (16)—Refer to FIGS. 5 & 6. This is driven by a separate solenoid actuator (39) to engage the electrical contacts between the line and load side connections to the device. The reset mechanism (16) is actuated after the reset button is depressed and remain in this position until it is released by actuation of the trip mechanism (15). The contacts isolate the line from the load side of the device. Most devices of prior arts use a mechanically-operated reset mechanism, unlike this invention which uses a solenoid actuator to reset the contacts.

Operation of the test and reset buttons go through a "depress then release" process meaning that once a button is depressed, it has to be released for the mechanism to activate. The "depress and release" term is alternatively expressed in this disclosure as "after the button is depressed". The microprocessor code routines using infinite loop starts after a button is released. This method is used to ensure accurate timing of contactor opening and closing operations.

FIG. 1 indicates the power supply lines as Line (2) and Neutral (3) which is applicable to 110V systems as commonly used in the USA. Line (2) may be designated as Line 1, and Neutral (3) may be designated as Line 2, when applied to 220V devices. Other designations for the power supply lines may be used for other voltages but the same principles of this disclosure apply without exception.

While the various electronic components of the AFCI circuitry employ a combination of individual components and integrated circuits as described, as and when required for improvement, any or all of these components and integrated circuits may be further integrated as Application Specific Integrated Circuits (ASIC) that will satisfy and meet the requirements of the device, method and system of this disclosure.

Figure 2:
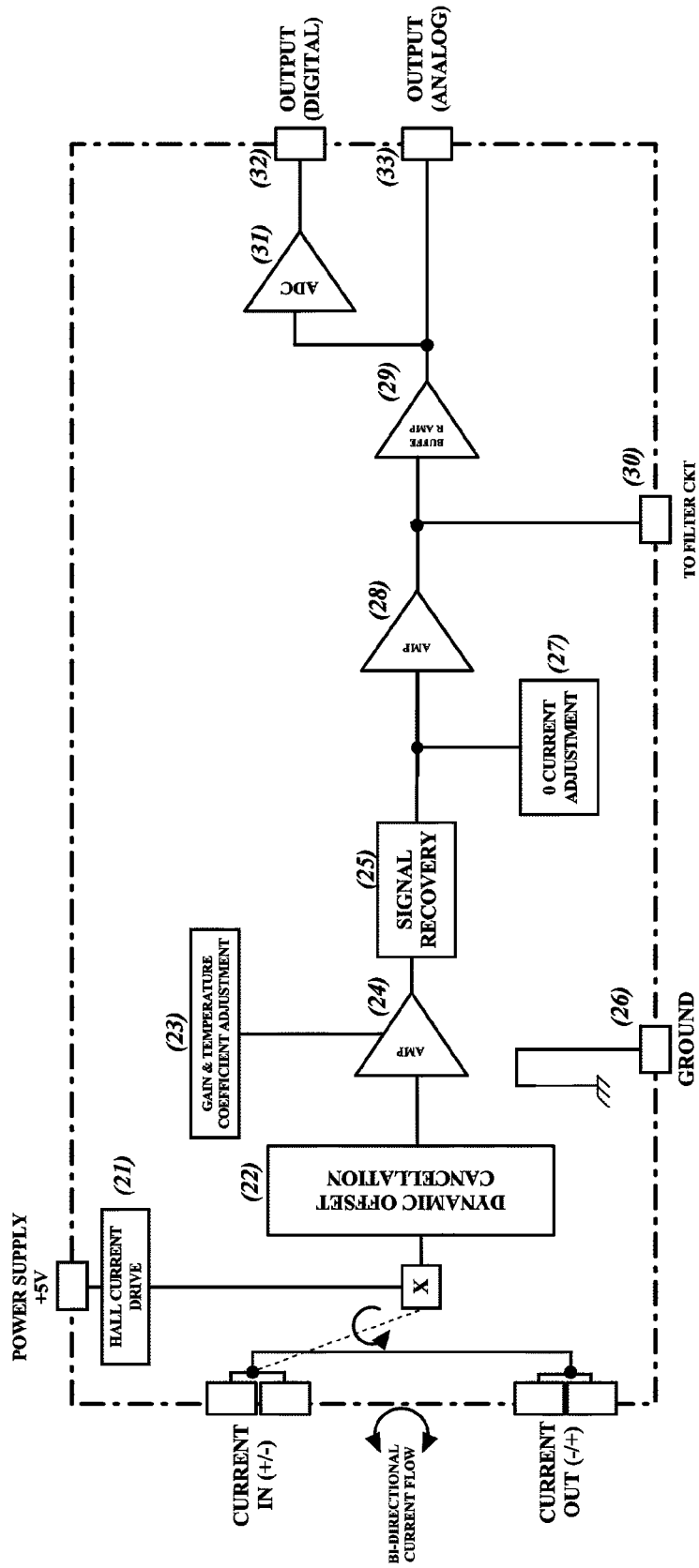
FIG. 2 is a functional block diagram of a fully integrated bi-directional Hall Effect Based Linear Current Sensor Circuitry.

2) FIG. 2 is a block diagram of Hall-Effect based, bi-directional, linear current sensor IC HES (1) as used in this invention. HES (1) consists of a Hall current drive (21); dynamic offset cancellation (22); gain and temperature coefficient adjustment (23); amplifiers (24)/(28)/(29); zero "0" current adjustment (29), analog and digital outputs (32)/(33); analog to digital converter (31). For practical purposes, any of these components mentioned may become external from the HES (1) without departing from the same principle of operation. HES (1) output voltages are proportional to the current flow. HES (1) has stable output offset voltage, nearly zero magnetic hysteresis and ratiometric output from supply voltage. HES (1) could also include detection circuits for signaling overcurrent or overload and other electrical faults, AC or DC, and could offer added features for detection of zero crossing of voltage signal.

Most if not all electrical fault detectors of prior arts or inventions employ current transformers to derive a secondary current used for fault sensing. Such current transformers are termed in prior arts differently as: current sensor, hall effect Sensor, current transformer, clamp, 2 resonant circuits, and other terms. Although they are all current transformers, they may vary in design and construction such as in number of turns, and other specific characteristics to obtain the sensing requirements. With excessive noise and inaccuracies associated with the use of current transformers that affects the detection of arc and other electrical faults, there are possibilities of attaining more accurate sensing with less noise by use of a fully integrated Hall-effect based bi-directional linear current sensor HES (1) as used in this disclosure. HES (1) is a power-driven current sensor IC which is different from the current transformers used in prior arts. Output signals from HES (1) have minimal or negligible noise that is ideal for use in the detection of electrical transient and steady state faults such as arc, overload or overcurrent, minimizing the need of conditioning the signals normally employed when the traditional current transformers are used. HES (1), compared to a current transformer gives AC voltage as output instead of current; it uses a copper or metallic conductive path to induce current instead of a line wire being passed through a coil wound on a metallic core; and has digital and analog outputs. HES (1) has low magnetic hysteresis that contributes to minimized noise or frequency distortions which is prevalent with the traditional current sensing transformers.

The HES (1) used in this invention is commercially available as supplied by Allegro Micro, specifically the ACS712 and ACS710 family of Hall Effect Current Sensors and variants thereof, all of which are classified by different current ratings according to actual applications. The specifications of these family of hall effect current sensor ICs are considered part of this disclosure.

Figure 3:
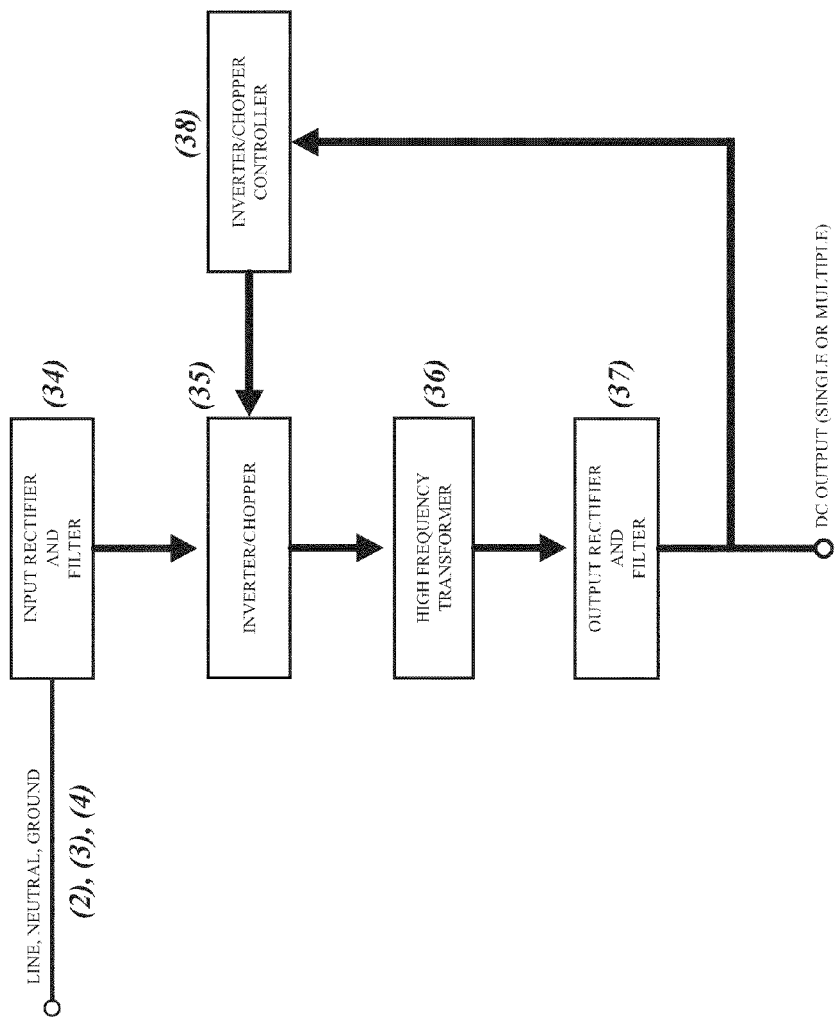
FIG. 3 is a functional block diagram of power switcher

3) FIG. 3 is a block diagram of an automatic Power Switcher PS (5) as used in this invention which provides stable DC supply voltage to the different power-driven components of the AFCI such as the microprocessor uP (8), Hall Effect Current Sensor IC HES (1), Buffer Amplifier BA (6), and programmable gain amplifier PGA (7). PS (5) is actually a Switch Mode Power Supply circuit that employs a high frequency transformer and power switcher integrated circuit (IC) that automatically adopts to the input voltage from a given range of 80-265 VAC (or any other applicable voltage range as specific designs may call for) to supply constant DC voltage output or multiple outputs such as 3.3 Volts and 5.0 Volts, or any voltage/s required to drive the various power-driven components of the device. With prior arts, typical devices such as AFCI and Ground Fault Circuit Interrupters (GFCI), uses a linear power supply source. These prior methods could generate excessive heating within the device. The power sources of prior arts have fixed voltage input therefore the output voltages are subject to fluctuations that causes unstable power supply to the power-driven components of the AFCI. Employing the automatic power switcher PS (5) gives stable output DC supply to the power-driven ICs not affected by line voltage fluctuations.

PS (5) allows the same AFCI detection and interruption circuitry to be commonly used for 120V, 220V, 240V, 265V and other voltage/s where devices of prior arts typically require different circuits for every voltage rating.

Alternatively, the AFCI may use linear power sources other than PS (5) to supply the DC power-driven components of the device, and used according to the embodiments of this disclosure.

Figure 4:
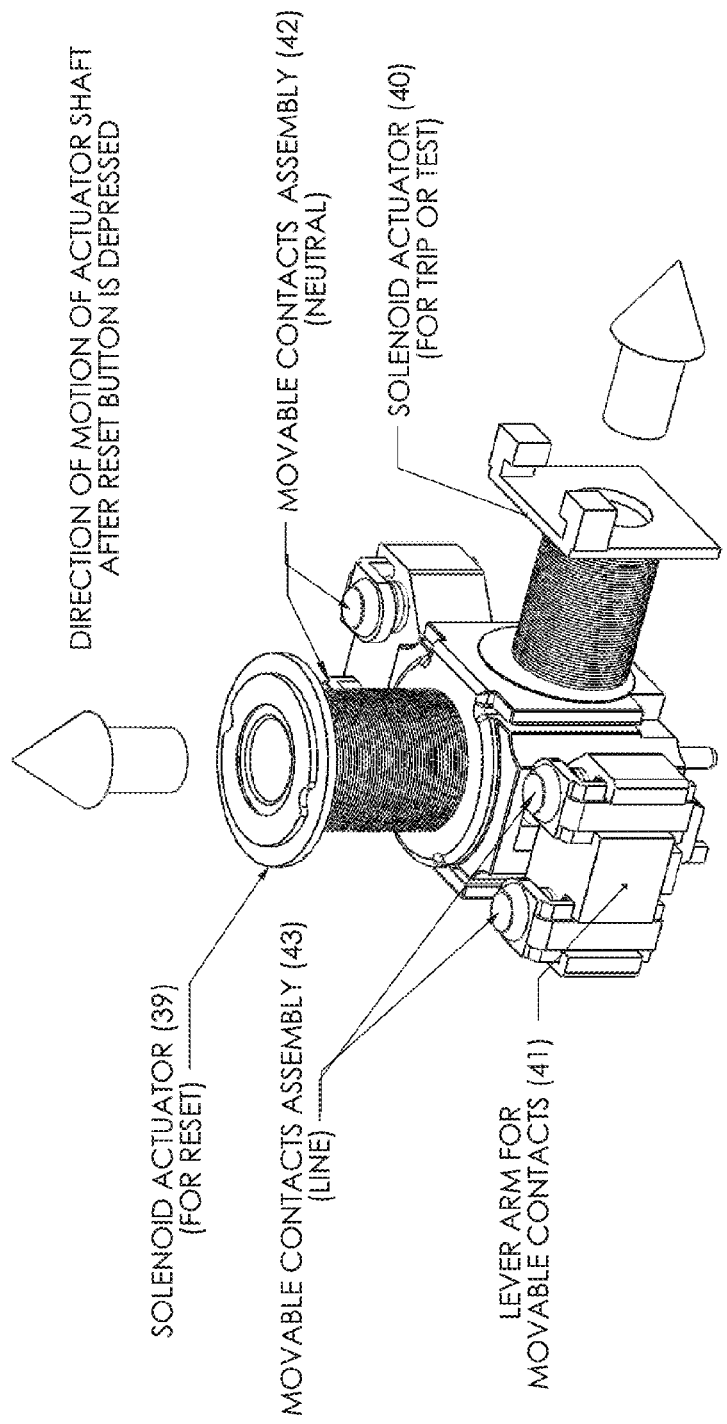
FIG. 4 is a perspective view of an electromagnetic contactor with trip and reset mechanism using two separate solenoid actuators.

4) FIG. 4 shows the electromagnetic contactor (17) of FIG. 1 with trip and reset mechanism using separate solenoid actuators as used with the AFCI.

FIG. 5 shows the cross-section of the test and reset mechanism of the said electromagnetic contactor (17)

Note that these drawings indicate Line and Neutral contacts and this is true for 2-wire circuits utilizing Line and Neutral connections as most 110V circuits in the USA. Where 220V devices are used, Line and Neutral may be substituted by Line 1 and Line 2, respectively, or other designations, without departing from the methods on this disclosure.

The electromagnetic contactor consists of solenoid Actuator (39) for reset, solenoid actuator (40) for trip or test, lever arm for movable contacts (41), movable contacts assembly (42) & (43). The trip and reset mechanisms are separately operated by actuators (39) & (40) which are controlled by the microprocessor uP (8). The actuators (39) & (40) are spring-loaded.

After the reset button is depressed, actuator (39) pulls the lever arm (41) upward to engage the movable contacts (42) & (43) with the stationary contacts which are positioned oppositely above them inside the device for line and load side connections. The shaft end of actuator (39) is attached to the lever arm (41) of the movable contacts (42) & (43). A notch (46) on the lever arm (41) forms a slide that latches with the shaft of actuator (40). The end of the shaft of actuator (40) which is pushed by recoil spring (47) slides and latches with the lever arm (41) and remains in this position until it is activated by the trip circuit where then the latch is released and the electrical contacts are disengaged. The electromagnetic contactor used in this disclosure is the circuit breaker electromagnetic tripping device disclosed in Patent No.: U.S. Pat. No. 7,298,236 B2 of Nov. 20, 2007. Apparatus of similar principle of operation and configuration using dedicated solenoid actuators for trip and reset could be used with the AFCI in lieu.

Most of prior arts of electrical fault protection devices such as AFCIs and GFCIs employ a solenoid actuator-operated tripping and a manually-operated reset mechanisms.

Alternatively, the AFCI with the associated hardware and modified microprocessor code, could also be operated using manually-operated reset and electrical solenoid-actuated tripping mechanisms.

Alternatively, the AFCI could also utilize a special configuration of an electromagnetic contactor with single solenoid actuator with reversible motion. This would require modified hardware and code for trip and reset operations, where the same actuator could operate reversibly by alternately triggering the AC supply signal in either the positive or negative slopes.

The electrical solenoid actuators mentioned above are all linear type, with or without enclosure and could operate on either AC or DC power supply with modified coil design and according to the embodiments of this disclosure.

5) FIGS. 6, 7, 8 & 9 discloses an alternative electromagnetic contactor used in the AFCI with trip and reset mechanism. This is an electromagnetic contactor which could be operated on either DC or AC power supply using a linear single-motion, single-coil, solenoid actuator for its trip and reset functions. Either push or pull motion actuator could be used with this contactor depending on the configuration of the lever arm, and the orientation between movable contacts assembly and the stationary contacts assembly. This mechanism is controlled by the microprocessor with modified code to satisfy the switching requirements.

This alternative electromagnetic contactor mainly consists of a single actuator coil (50) mounted on its frame (49) with a displacement and locking guide stem (55); actuator shaft (56), locking stem (57), displacement stem (58), lever arm for contacts assembly (52), movable contacts assemblies (53) & (54); recoil spring (59); lever arm guide and retainer cap (60). Inside guide stem (55) are slots and ribs that guide the movement of displacement stem (58). The ribs of guide stem (55) have two saw-tooth shaped projections (55a) & (55b). (55a) are the major saw-tooth projections which serves as the upper position lock, whereas (55b) are the minor sawtooth projections that slopes to the slots (55c). The saw-tooth shaped projections (55a) and (55b) are sloped with the same angle but of opposite orientation in the assembly with the saw-tooth projections (58b). Locking stem (57) is equipped with ribs on the side that moves along the slots (55c) on guide stem (55) to keep it firmly in position. The top of locking stem (57) has saw-tooth shaped projections that locks with projections (58b). For every solenoid actuation, the wedging actions between the sawtooth-shaped projections of stems (55), (57) & (58) causes the displacement stem (58) to turn incrementally which positions the projections (58b) to either the upper lock (55d) or on the (55c) slots where they rest on top of guide ribs (57c) at the lower lock (55e) position. The upper (55d) and lower lock (55e) positions respectively correspond to the electromagnetic contactor RESET and TRIP positions. Recoil spring (59) pushes the assembly downwards to provide cushion for proper contact pressure between movable and stationary contacts, as well as to support proper positioning and integrity of the assembly. Locking stem (57) may optionally be coupled with actuator shaft (56).

One position of the mechanical locking and displacement assembly (51) is such that the projections (58b) are engaged with (57b) and guide ribs (57c) are resting on the lower lock position (55e) of guide stem (55). This position corresponds to the TRIP position of the electromagnetic contactor wherein the movable contact assemblies (53) & (54) are disengaged with the stationary contact assemblies positioned directly opposite them.

The other position of the locking and displacement mechanism (51) is such that the projections (58b) are engaged with the upper lock (55d) positions on the saw-tooth projections of stem (55). This position corresponds to the RESET position of the electromagnetic contactor wherein the movable contact assemblies (53) & (54) are engaged with the stationary contact assemblies positioned directly opposite them.

On RESET position, projections (58b) are engaged with the saw-tooth projections (57b) almost halfway down from the top and restrained in this position by the ribs (57c) moving along the slots (55c).

When actuator coil (50) is activated, shaft (56) pushes stems (57) & (58) upward through and beyond the slots (55c) of guide stem (55). At this point, guide ribs (58a) gets out of the slots (55c) and projections (58b) continues its slide down to the bottom of the slope of the projections (57b) thereby causing a side shift motion that repositions the projections (58b) towards the major saw-tooth projections (55a) slightly below the top. At this position, the projections (58b) have nowhere to go but continuously slide down the slope towards the upper lock position (55d). This position corresponds to the RESET position of the electromagnetic contactor wherein the movable contacts assemblies (53) & (54) are engaged with the stationary contact assemblies of the AFCI.

The next time the actuator coil is activated, shaft (56) pushes stems (57) & (58) upward through and beyond the slots of guide stem (55): At this point, guide ribs (58a) gets out of the slots (55c) and the projections (58b) continues its slide down to the bottom of the slope of the projections (57b) thereby making a side shift motion that repositions the projections (58b) towards the minor saw-tooth projections (55b) slightly below the top. At this position, by the pressure imposed by recoil spring (59), the projections (58b) have nowhere to go but continuously slide down the slope getting inside the slots (55c) of the guide stem until the guide ribs (57c) rests on the lower lock position (55e). This position corresponds to the TRIP position of the electromagnetic contactor wherein the movable contact assemblies (53) & (54) are disengaged with the stationary contact assemblies of the AFCI.

The orientation of the saw-tooth projections (55a), (55b) & (58b) directs the incremental motion of displacement stem (58b) either clockwise or counter-clockwise. The depth of slots (55c) and the slopes or angles in reference to x-axis drawn from the bottom of each of the saw-tooth projections (55a), (55b), (57a) & (58b) may be varied according to the displacement desired which is also a factor of the diameter of stem (57) and the pitch of the saw-tooth projections (57b).

Although this alternative electromagnetic contactor is disclosed for a 2-pole application, without any limitations and using the same methods or techniques of this disclosure, the contacts and lever assemblies may be configured for use on contactors for 1-pole and any number of poles.

Although the alternative electromagnetic contactor of FIGS. 6, 7, 8, 9 is disclosed for use on the AFCI, the same device, principles, techniques and methods could be adopted for use in any other applications and industries beyond the scope of this disclosure.

6) End-of-life indication and protection is required with GFCI devices to determine the integrity of the device to operate normally and/or within the lifespan it is designed for. While at the time of this disclosure, AFCIs are not yet required to have this feature, anticipating its future need, it is included in this disclosure. End-of-Life is determined by any one of the following conditions:
  a) Through the microprocessor clock counter where the device is to indicate end-of-life condition when certain programmed period is reached. For the purpose of this disclosure, a period of 5 years is established in the microprocessor code, however, this could be varied according to actual design and future standard requirements.
  b) The inability of the reset mechanism to engage contacts between the line and load. This is detected through test routines in the microprocessor code in association with hardware functions which indicate when the contacts do not engage after the reset button is depressed. By the reset button not engaging the contacts, it could mean hardware or mechanical failures or both, that constitute an end-of-life condition.
  c) The inability of the test or trip mechanism to disengage contacts between the line and load. This is detected through test routines in the microprocessor code in association with hardware functions which indicate when the contacts do not trip after the reset button is depressed. By the reset button not engaging the contacts, it could mean hardware or mechanical failures or both, that constitute an end-of-life condition.

When any of the above conditions are determined, this in effect terminates the ability of the device to reset and therefore deemed non-operational and must be replaced.

When an end-of-life condition occur, a visual indicator (LED) lights up either as a steady or blinking pattern which is discretionary to the device manufacturer. Optionally, indication for end-of-life condition could be associated with an audible signal which is either steady or intermittent. This end-of-life feature is also covered in the Code Description portion of this disclosure.

Figure 10:
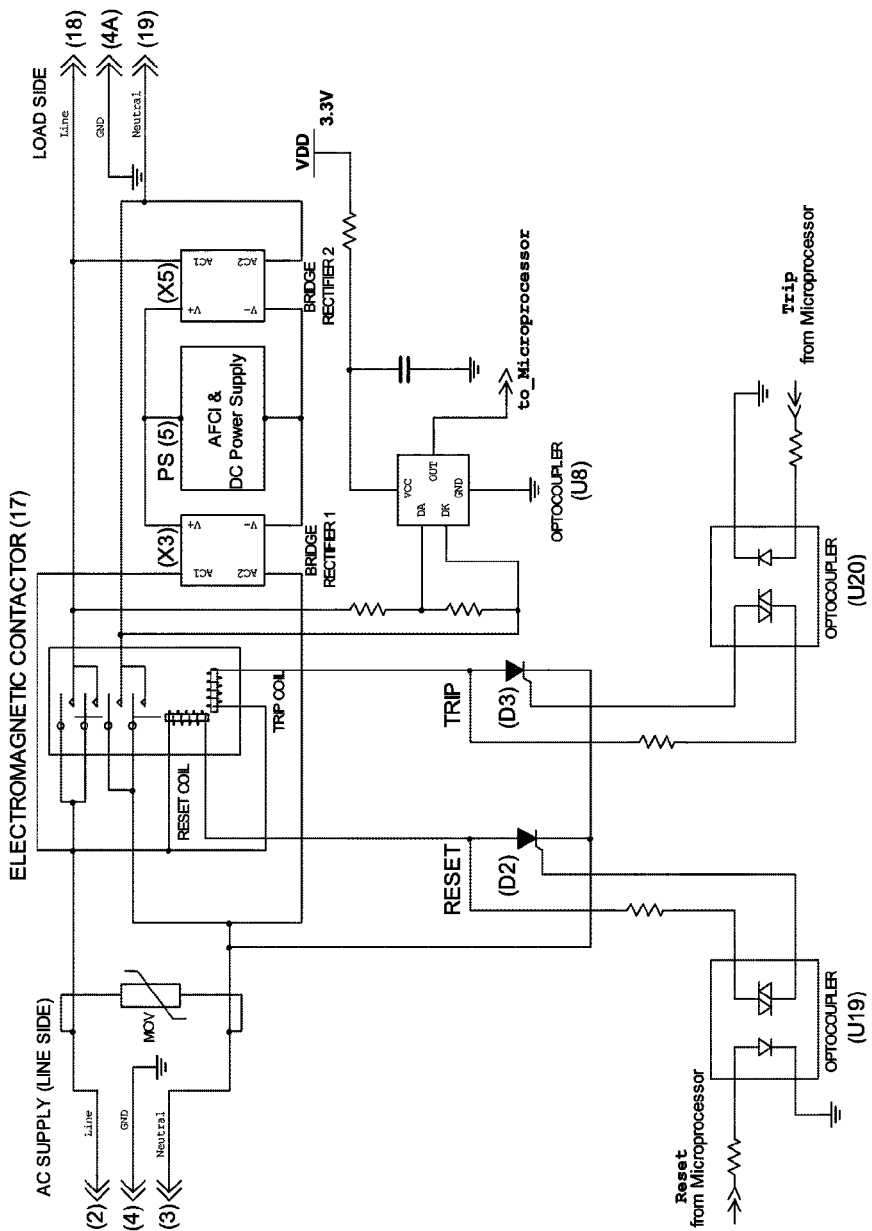
FIG. 10 is a schematic of AFCI miswire circuitry.

7) FIG. 10 is a partial schematic taken from the AFCI circuitry showing the miswire circuit of the device. A miswire is a condition where the power supply line side wiring is inadvertently connected to the load side, and the load side wiring connected to the line side of the device. Protection from this condition is required, and typically involve Arc Fault Circuit Interrupters (AFCI), Ground Fault Circuit Interrupters (GFCI) receptacles and similar devices where wiring need to be made where and as designated. Testing for miswire is typically required every time a receptacle is installed, after each reset, and every time power to the device is restored after a power failure.

When a miswire condition is determined, the trip mechanism activates to disengage the contacts between line and load side of the device. This disclosure involves the use of two similar bridge circuits on both line and load side of the device which are connected to PS (5) that supply the power driven components of the AFCI. Either one of the 2 bridge circuits at any given time could operate the detection circuitry.

In prior arts, detection circuitry is connected only through the line side of wiring devices, wherein a miswire could have the device without an operational fault detection circuitry. With the miswire circuit and modified code, wiring devices such as AFCI, GFCI and similar devices could become reversible with respect to line and load connections. This reversibility feature applies only in situations where miswire protection.

Miswire protection is required for receptacle AFCI and GFCI to comply with applicable UL standards. This miswire circuit operates in conjunction with the microprocessor as explained in details in the Code portion of this disclosure. Indicators are provided to annunciate the occurrence of miswire through light indication, steady or blinking, with or without an accompanying audible indicator.

8) Visual and audible indicators are provided with this invention to indicate device functions and conditions.

There are multiple indicators: visual indicators 11/12 which are either Light Emitting Diodes (LED) or Liquid Crystal Displays (LCD), and audible indicator 13. Any number of indicators may be used to annunciate conditions, individually or in multiples, as well as by combinations thereof. I/O (input/output) pins are limited in number. The $I^2C$ (inter-integrated circuit) output permits many add-on indicators controlled by the microprocessor but I/O (input/output) pins are limited in number. Indicators of the AFCI include the following:
  a) Power On—this indicator is always on when power is on. No audible device is associated with it.
  b) Fault Condition—this indicator actuates when the AFCI detects an arc or other electrical faults and trip mechanism is activated. The visual indicator could be a steady or a blinking light, and may be associated with an audible alarm. This indicator may serve dual function to indicate fault and end-of-life conditions, in a steady or blinking pattern.
  c) End-of-Life—this indicator actuates when the device is no longer able or safe to operate or when the designed lifespan is reached. This indicator may serve dual function to indicate fault and end-of-life conditions, in a steady or blinking pattern.
  d) Optional Indicators (visual and audible)—by the type of fault that occurred, the device could optionally be provided with a means to identify whether it is an arc, overload or overcurrent, short circuit, surge, ground, or any other electrical fault that occurred which triggered the device to trip. This is accomplished through the microprocessor code routines and associated hardware modification.

The audible alarm could be in the form of a buzz, bell or any sound of continuous or intermittent nature to indicate functional conditions.

The number of visual indicators could be increased to indicate individual conditions, either singly, or in multiples through steady or intermittent patterns.

9) AFCI Code Description

The term "code" as used in this disclosure is the program by which the microprocessor operates to satisfy the requirements of the AFCI according to the embodiments of this disclosure.

Figure 11:
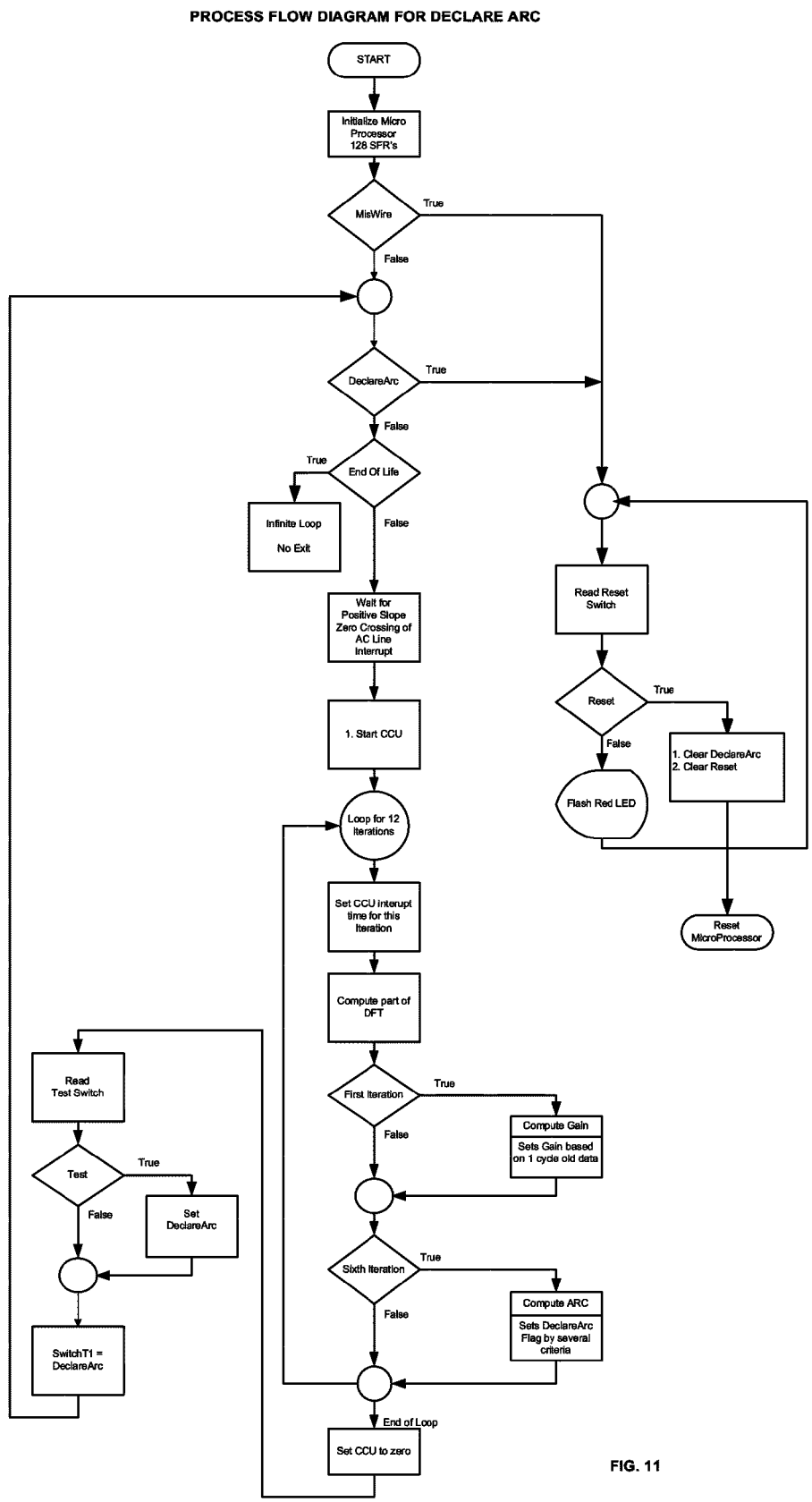
FIG. 11 is a process flow diagram of Declare Arc.
Figure 12:
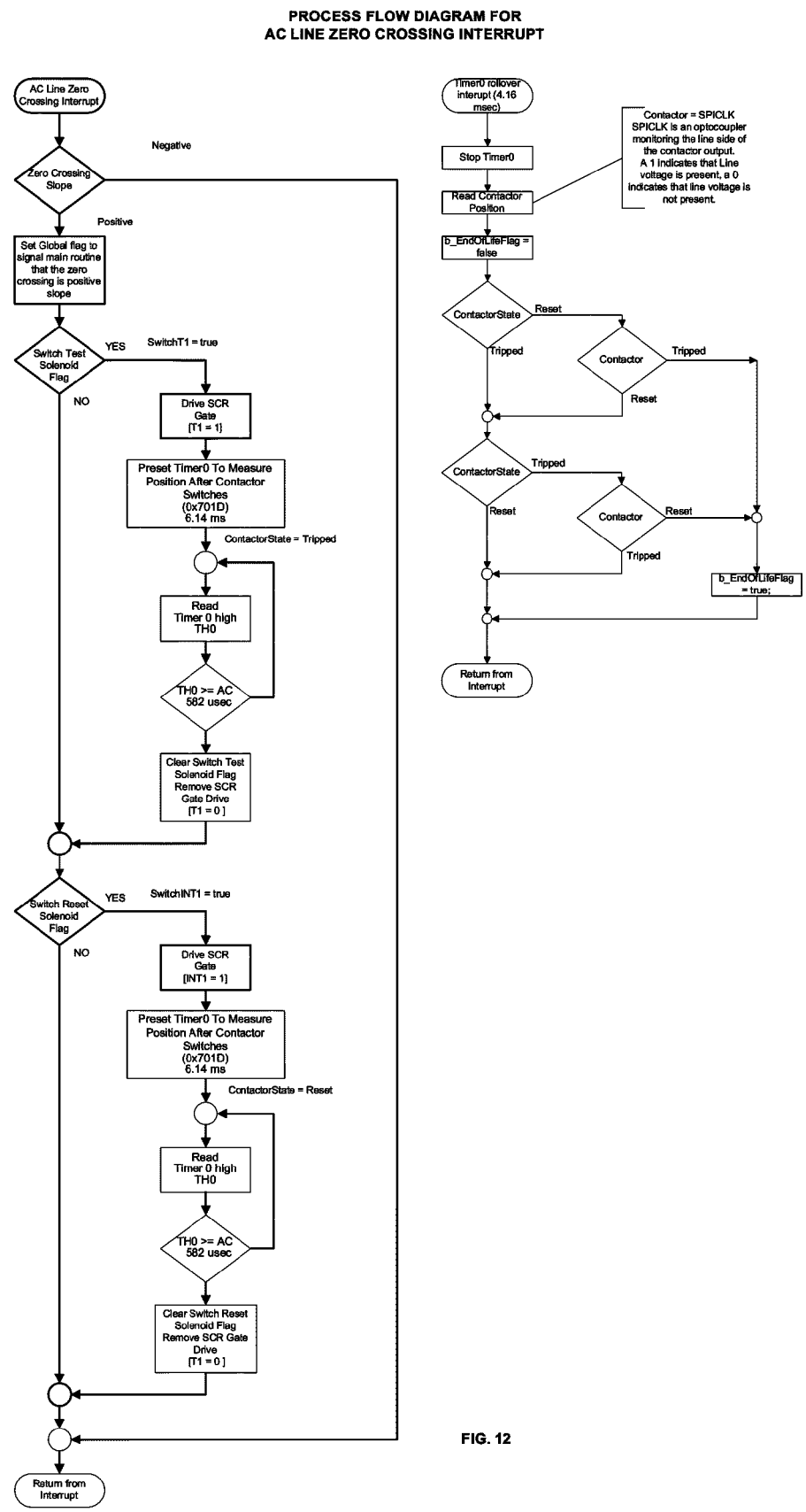
Figure 13:
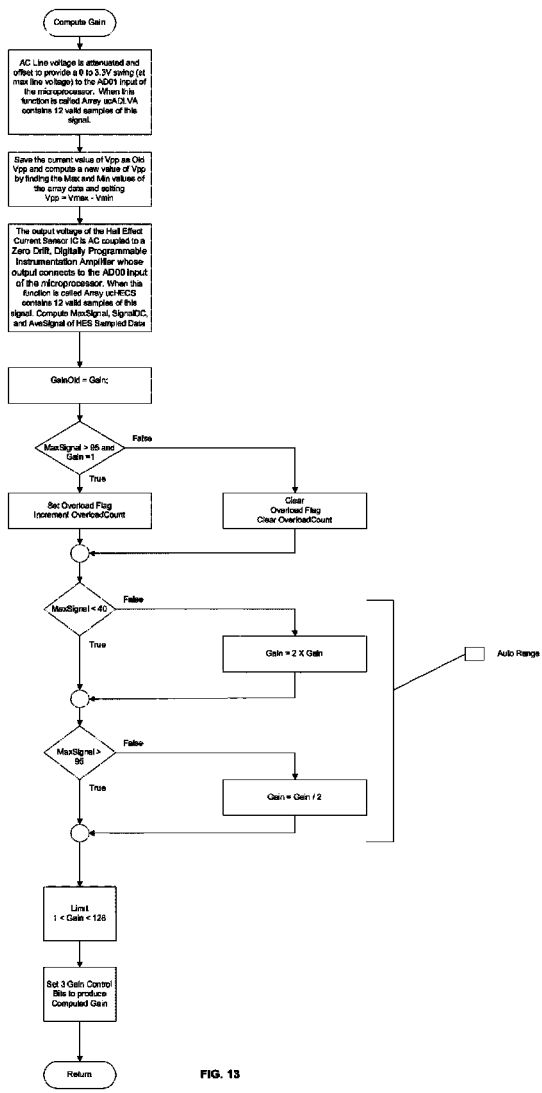
FIG. 13 is a flow diagram for compute gain.
Figure 14:
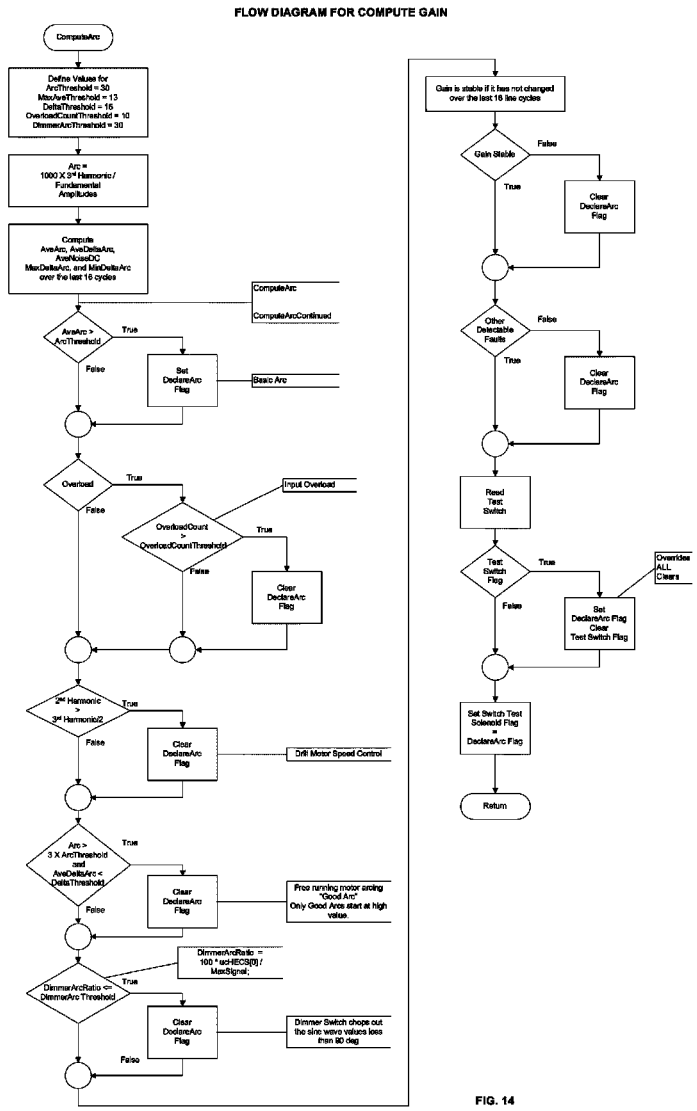
FIG. 14 is a flow diagram of compute arc.

The code development for AFCI is deeply involved as there are not many references to begin with, and required extensive reliance on actual observations of arc and fault signals. In developing the code, the following process flow diagrams have been used, and to one skilled in the art of arc and electrical fault protection, variations may be implemented in the order of routines, but results will not deviate in or depart from the basic principles established in this disclosure:

FIG. 11 Process Flow Diagram for Declare Arc
FIG. 12 Process Flow Diagram for AC Line Zero Crossing Interrupt
FIG. 13 Process Flow Diagram for Compute Gain
FIG. 14 Process Flow Diagram for Compute Arc a) Observation of Arcs The Hall Effect Current Sensor HES (1) output voltages are observed in both the time and frequency to detect the presence of arcs. Arcs are easily detected in the frequency domain.

Prior arts in arc fault detection and currently available technical references do not define or explain how arc is measured. Among multiple methods and systems of measurement and calculation of Arcs used in the detection system in this disclosure is as based on the ratio of the $3^{rd}$ and fundamental harmonic amplitudes. From observations, it is established in this disclosure as the ratio of the $3^{rd}$ and the fundamental Harmonic Amplitudes multiplied by a constant which is arbitrary to the developer or manufacturer of AFCI, herein assigned as 1000. For mathematical considerations, the following formula is used:

Arc=1000×$3^{rd}$ Harmonic Amplitude divided by the Amplitude of the fundamental.

**Note: 1000 is an arbitrary multiplier which could be varied to match testing parameters and development tools' capabilities.

The above ratio is used in the development of the code to establish thresholds and basis for comparison, calculation and determination of arcs and other workings of the AFCI.

When dealing with arcs on AC lines, 60 Hz is the fundamental frequency used in the U.S.A. and some other countries, whereas 50 Hz is the fundamental frequency in the rest of the countries in the world.

The flag DeclareArc is set or cleared when calculated parameters are compared with threshold values. When an Arc is greater than ArcThreshold in amplitude, DeclareArc is set. ArcThreshold is a level set by observation of many arcs to determine those that are sufficiently large to warrant opening the AFCI contacts.

To develop an Arc Fault Circuit interrupter (AFCI) that can measure and process the Hall Effect Current Sensor HES (1) output to determine if an Arc is present and disengage the contacts between the line and load side of the device when an arc is present, a digital signal processor (DSP) is used. Measurement of signals in the time domain, conversion to the frequency domain, and analysis of the frequency domain parameters are performed. There are many microprocessors which can accomplish this task, but low cost is a major consideration for the end product to become affordable to consumers. Some members of the 80C51 eight-bit microcontroller/microprocessor family with the required peripherals are applicable for the purposes of this disclosure, and the NXP P89LPC935 or P89LPC936 were selected. NXP P89LPC936 was used in the development for bigger memory capability as used on external measurement and display interfaces, however, NXP P89LPC935 is intended for mass production with NXP P89LPC936 as an alternative. In this disclosure, both NXP P89LPC935 and P89LPC936 are considered as one and the same since they are of the same specifications with the exception of output capabilities, as thus explained.

The NXP P89LPC935/9361 are new microprocessors that are pin-compatible with the NXP P89LPC935/P89LPC936 and have more peripheral devices including a programmable gain amplifier (PGA). When development tools are available, these microprocessors may be used to replace the NXP P89LPC935/P89LPC936 and AD8231 (Programmable Gain Amplifier manufactured by Analog Devices) currently used in the AFCI. The 80C51 family of microprocessors are also termed 8051.

There are thousands of microprocessors that are classified in the 8051 family. The primary variations are machine operating speed and peripherals built into the microprocessor. There are several more expensive variants of this device such as the NXP P89LPC9361 and P89LPC9351. Other variations will certainly follow, where the basic specifications and peripherals are the same as NXP P89LPC935 and P89LPC936.

The microprocessor is configured according to the AFCI requirements. This configuration of a set of microprocessor peripherals perform sampling to support coherent DFTs (Direct Fourier Transforms, alternatively termed Discrete Fourier Transforms) and use their properties to compute and detect arc then disengage the contacts between the line and load side of the device when an arc is present. Coherent DFT is an object of this disclosure and explained in the following embodiments.

b) Direct Fourier Transforms

The Scientist and Engineer's Guide to Digital Signal Processing by Steven W. Smith is used in some of the DFT references in this embodiment. (Most parts of this section were taken directly from this reference) The discrete Fourier transform changes an N point input signal into two N/2+1 point output signals. The input signal contains the signal being decomposed, while the two output signals contain the amplitudes of the component sine and cosine waves. The input signal is said to be in the time domain. This is because the most common type of signal entering the DFT is composed of samples taken at regular intervals of time. Any kind of sampled data can be fed into the DFT, regardless of how it was acquired. The term "time domain" in Fourier analysis, may actually refer to samples taken over time, or it might be a general reference to any discrete signal that is being decomposed. The term frequency domain is used to describe the amplitudes of the sine and cosine waves. The frequency domain contains exactly the same information as the time domain, just in a different form. If one domain is known, the other can be calculated. Given the time domain signal, the process of calculating the frequency domain is called decomposition, analysis, the forward DFT, or simply, the DFT. If the frequency domain is known, calculation of the time domain is called synthesis, or the inverse DFT. Both synthesis and analysis can be represented in equation form and computer algorithms. Standard DSP notation uses lower case letters to represent time domain signals, such as x [ ], y [ ], and z [ ]. The corresponding upper case letters are used to represent their frequency domains, that is, X [ ], Y [ ], and Z [ ]. For illustration, assume an N point time domain signal is contained in x [ ]. The frequency domain of this signal is called X [ ], and consists of two parts, each an array of N/2+1 samples. These are called the Real part of X [ ], written as: Re X [ ], and the Imaginary part of X [ ], written as: Im X [ ]. The values in Re X [ ] are the amplitudes of the cosine waves, while the values in Im X [ ] are the amplitudes of the sine waves (not worrying about the scaling factors for the moment). Just as the time domain runs from x[0] to x[N+1], the frequency domain signals run from Re X[0] to Re X[N/2], and from Im X[0] to Im X[N/2].

Fourier analysis is a family of mathematical techniques, all based on decomposing signals into sinusoids. The discrete Fourier transform (DFT) is the family member used with digitized signals. The real DFT, a version of the discrete Fourier transform that uses real numbers to represent the input and output signals, is used in the AFCI in this disclosure.

The analysis equations for calculating the DFT are:

$$Re X[k] = \sum_{i=0}^{N-1} x[i]\cos(2\pi ki/N)$$

$$-Im X[k] = \sum_{i=0}^{N-1} x[i]\sin(2\pi ki/N)$$

$$Mag X[k] = \sqrt{(Re X[k])^2 + (Im X[k])^2} :$$

where (i) is the index of the data array, (k) is the index of the frequency array c) Data Sampling Requirements Sampling is accomplished with an Analog to Digital Converter (ADC) wherein sampling time can be controlled. Usually they are triggered with a pulse generator to obtain a series of samples taken at a desired rate. A series of samples is usually stored in array for later processing. http://www.analog.com/static/imported-files/seminars_webcasts/36902495568568Section8.pdf, Practical Analog Design Techniques Section 8 Distortion Measurements by Walt Kester is used for reference where coherent Fast Fourier Transforms (FFT) for spectrum analyzer measurements are covered. The same theory and limitations apply to DFTs. Excerpts of his work with slight modifications are presented herein as support for coherent sampling.

In order to obtain spectrally pure results, the FFT data window must contain an exact integral number of sine wave cycles. These frequency ratios must be precisely observed to prevent end-point discontinuity. This method of FFT testing is referred to as coherent testing because two locked signal sources are used to insure the proper ratio (coherence) between the sampling clock and the sine wave frequency.

Coherent DFT testing ensures that the fundamental signal occupies one discrete line in the output spectrum. Any leakage or smearing into adjacent bins is the result of aperture jitter, phase jitter on the sampling clock, or other unwanted noise due to improper layout, grounding, or decoupling.

If the ratio between the sampling clock and the sine wave frequency is such that there is an endpoint discontinuity in the data, then spectral leakage will occur. The discontinuities are equivalent to multiplying the sine wave by a rectangular windowing pulse which has a sin(x)/x frequency response. The discontinuities in the time domain result in leakage or smearing in the frequency domain, because many spectral terms are needed to fit the discontinuity. Because of the endpoint discontinuity, the DFT spectral response shows the main lobe of the sine wave being smeared, and a large number of associated sidelobes which have the basic characteristics of the rectangular time pulse. This leakage must be minimized using a technique called windowing (or weighting) in order to obtain usable results in non-coherent tests.

This situation is exactly what occurs in real-world spectral analysis applications where the exact frequencies being sampled are unknown and uncontrollable. Sidelobe leakage is reduced by choosing a windowing (or weighting) function other than the rectangular window. The input time samples are multiplied by an appropriate windowing function which brings the signal to zero at the edges of the window. The selection of an appropriate windowing function is primarily a tradeoff between main-lobe spreading and sidelobe rolloff.

In real-world DFT spectral analysis applications, the exact input frequencies are unknown, something must be done to minimize the sidelobes resulting from a non-integral number of cycles are contained within the data window. Sampling in an AFCI can be set up so this is not so. The input sine wave frequency is the AC line, 60 Hz in the USA (50 Hz in other countries). The sampling frequency is chosen such that precisely an integral number of cycles are contained within the data window (coherent sampling). The DFT assumes that an infinite number of these windows are placed end-to-end to form a periodic waveform as the periodic extensions. Under these conditions, the waveform appears continuous (no discontinuities), and the DFT or FFT output will be a single tone located at the input signal frequency.

Precisely an integral number of two cycles of the three sine waves (fundamental, second harmonic, and third harmonic) must be contained in the data window. So 60×2×(1+2+3)=720 is the minimum sampling frequency. This is equivalent to sampling 12 times per 60 Hz cycle. The sample period must be constant. The value of N (where N is the number of samples) determines the frequency bin width, Delta f=fs/N (where fs is the sample frequency). N is proportional to frequency resolution. The frequencies of the signals of interest are known so increasing N to increase resolution yields no benefit.

Aliasing can be a problem in sampled data systems. With a half sampling frequency of 360 Hz, the $9^{th}$ harmonic (540 Hz) is folded onto 180 Hz ($3^{rd}$ harmonic). The AFCI contains a 4 pole Butterworth filter with its cutoff at 270 Hz. This filter is used for both anti-aliasing and noise removal. The requirement for no aliasing at full scale 180 Hz input for an 8-bit ADC is 48 dB attenuation of the 540 Hz signal from the 180 Hz signal. This filter provides a theoretical 23.7 dB attenuation. Signal with this attenuation will not affect Arc calculations and high order filters that do provide the 48 dB attenuation require very accurate components.

One of the objectives of this disclosure is to develop an AFCI that can be manufactured at a low cost to be commercially viable or affordable to consumers. There are many digital signal processors (DSP) and high word width microprocessors that can perform the required sampling. Another objective is to design a sampling scheme that will fit in an eight-bit microprocessor and its peripherals.

Figure 15:
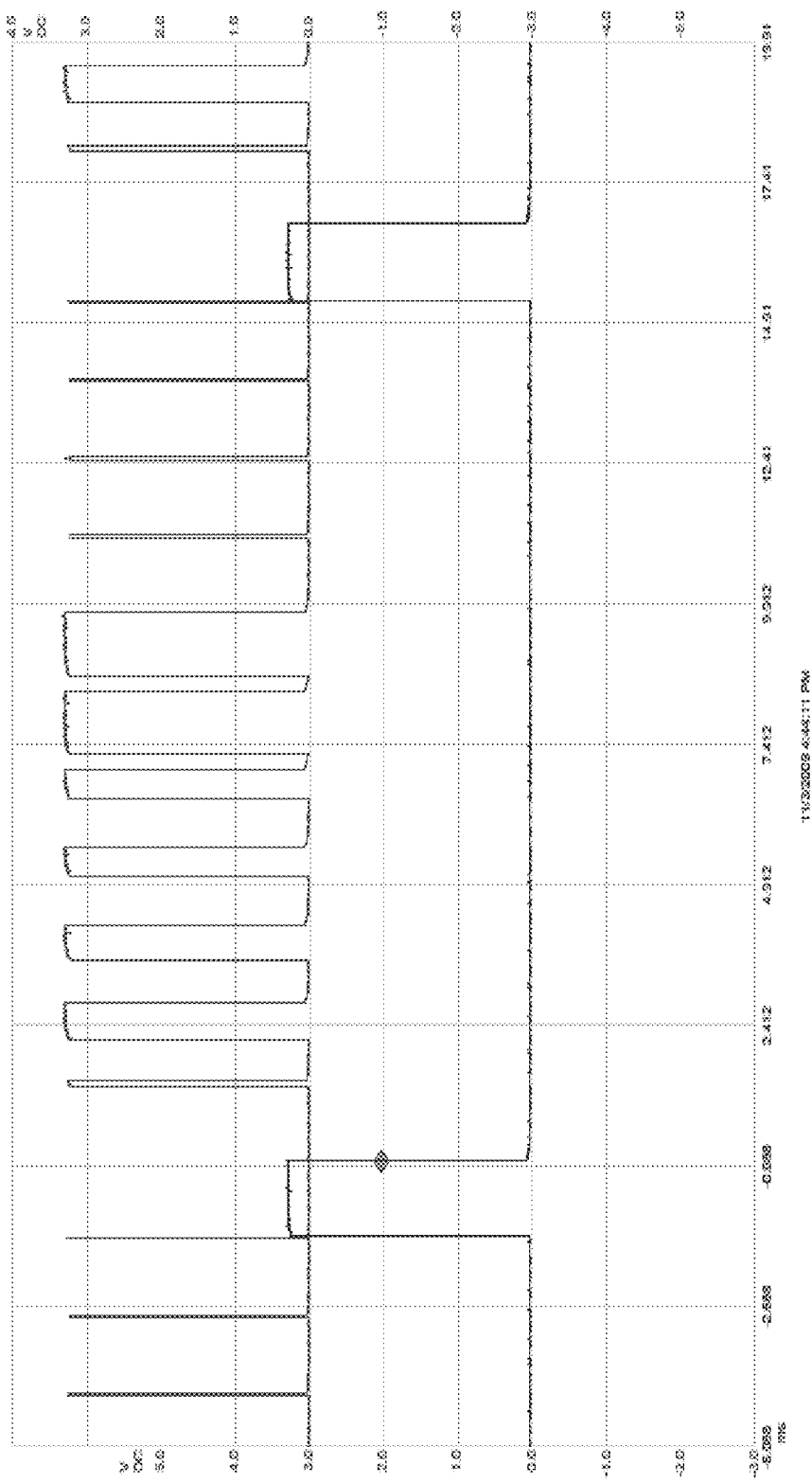
FIG. 15 is a Synchronization Diagram.

As shown in FIG. 15, the negative slopes on the top waveform are the required ADC sample strobe interrupts. These strobes count from 0 to 10. The negative slope on the bottom waveform is the positive slope zero crossing of the AC line voltage. In both waveforms, the flat high signal is a wait for the strobe. The two signals are synchronized by the wait on the lower signal starting at the strobe for ADC sample 10. Calculations are performed during the low signal of the top waveform. These calculations must complete before the strobe that ends the cell. Configuring the peripherals in the microprocessor to generate this timing signal is one of the claims of this disclosure.

In order to obtain spectrally pure results, the DFT data window must contain an exact integral number of sine wave cycles. These frequency ratios must be precisely observed to prevent end-point discontinuity. For an AFCI, these requirements are eased by the signal always being the power line signal (transformed or attenuated but with the same frequency). The zero crossing is determined with an analog comparator and all operations synchronized with it. The first system assumes the frequency is 60 Hz and computes timing on this assumption. Alternatively, for 50 Hz Line frequency, timing will be computed on this measurement.

10) Microprocessor Configuration and Code to Meet Coherent Sampling Requirements:

The AFCI code was written in C, however, other languages may also be used. For the purposes of this disclosure, the term code refers to and the same as the program by which the AFCI operates.

Only DC (0th harmonic), the fundamental (1st harmonic), 2nd harmonic, and 3rd harmonics are used in this disclosure. Two samples per min period yields (2*2*3)=12 samples per cycle of the power line as a minimum for number of sine wave cycles contained within the data window. Interrupts are generated at Line Voltage zero crossings, and at the end of a period equal to the Line Voltage cycle/12 or 1 cell. The positive to negative zero crossing shall be the reference. Voltage and current signals will be sampled by this 60*12=720 Hz signal. It is initiated by the positive to negative zero crossing interrupt, and counting 1.39 msec period interrupts which trigger ADC samples. This ensures coherent sampling.

Coherent sampling ensures no spill-over between the frequency bins, thereby eliminating the requirement for windowing.

Due to the small number of harmonics computed, the various fast computing techniques (FFT) have little to offer over the simple Discrete Fourier transform. Basis Functions are pre-computed to speed computation.

a) Data Sampling Realization

The selection of the NXP 89LPC935/89LPC936 microprocessors was partly based on their internal multi-channel analog to digital converter (ADC), analog comparators, Capture/Compare Unit (CCU), and 167 nsec machine cycle. Their I²C were used to display data during development and could be used for additional displays on mass production, when required.

The ADC samples both Line Current and Line Voltage signals.

b) Synchronization of sampling to AC Line Voltage

Two analog comparators are provided on the NXP P89LPC935/936. Input and output (I/O) options allow use of the comparators in a number of different configurations. Comparator operation is such that the output is a logic 1 (which may be read in a register and/or routed to a pin) when the positive input (one of two selectable pins) is greater than the negative input (selectable from a pin or an internal reference voltage). Otherwise the output is a zero. Each comparator may be configured to cause an interrupt when the output value changes.

A resistive divider is used to attenuate and DC shift the line voltage at the output of the Hall Effect Current Sensor HES (1) to match the input limits of a buffer amplifier that provides the reference signal to the Analog Comparator. This signal is combined with the Analog Comparator output to provide positive feedback hysteresis which increases the slope of the reference at the instant of switching and produces a more accurate synchronization.

The reference signal to the Analog Comparator (AnC) is provided by the Digital to Analog Converter (DAC) of ADC1. The anti alias filter causes a phase shift between the voltage signal to the AnC and the current signal to the ADC. A capacitor was added to the resistive divider to match the voltage channel phase shift to the current channel phase shift.

The DAC reference signal is set within the 3.3 V range with the high signal limit of 3.3V, being the power supply voltage of the microprocessor. It is adjusted to compensate for phase shifts in the current measurement channel. This setup gives an interrupt on the AC line zero crossing. The AnC interrupt service routine (ISR) differentiates between positive and negative slope zero crossings. A global variable is set to signal the main routine which waits for this signal (only ISRs can respond to interrupts, global variables are one way to communicate between the procedural code and ISRs). This provides synchronization of the main function to the AC Line positive slope zero crossing.

c) Contactor Solenoid actuator Switching

The AnC ISR drives the contactor solenoid actuator switches when the appropriate flag is set. This ensures switching occurs at zero voltage, enhancing the life of the contactors. The Flags are set when an arc is declared or after the Reset switch is depressed. The Test switch declares an arc after it is depressed.

d) CCU generates the ADC synchronous strobe at 12 samples per cycle

The time of each of the 11 interrupts generated by output compare channel A is computed and stored for use in the data sampling loop. The $0^{th}$ interrupt is generated by the AnC on the positive slope zero crossing. These times are in CCU timer counts.

e) Precompute Basis Functions

The basis functions are not a function of data. They are computed once and stored. It is possible to store them in code memory and not need to compute them once per reset.

f) Hardware set up for infinite loop

The NXP register names are used to facilitate reference to the NXP User Manual. Code variable names are used to facilitate reference to the code.

The ADC is operated in auto scan, single conversion mode. Channels AD0DAT0 and AD0DAT1 are automatically scanned when software starts the conversion. This software is in the Capture Compare Unit (CCU) ISR. When the timer reaches the Output Compare A value, an interrupt is generated which activates the CCU ISR to run the startup code. After each successful compare, the compare reference is updated for the next compare cycle. When 11 cycles have been completed, the CCU timer is reset and waits on the positive slope zero crossing flag to resume the loop.

A crystal oscillator at 12.000 MHz provides timing for the AFCI. This oscillator is a microprocessor peripheral. Maximum computation speed is essential for the Central Processing Unit (CPU); hence, the DIVM divider is set to 0 for no division. The output of the DIVM divider is called CCLK. It is divided by 2 to make PCLK which drives most of the peripherals including the CCU, but not the Analog to Digital Converter (ADC).

The AFCI requires a relatively high computation rate. The P89LPC935/936 uses an enhanced 80C51 CPU which runs at six times the speed of standard 8051 devices. A machine cycle consists of two CPU clock cycles, and most instructions execute in one or two machine cycles. When using an oscillator frequency above 12 MHz, the reset input function of P1.5 must be enabled, which requires hardware. A crystal oscillator at 12.000 MHz was selected for these reasons. The resulting machine cycle is 166.7 nsec. OscillatOr Clock (OS-CCLK) is 12.000 MHz.

The CCU runs on the CCUCLK, which is PCLK (6.0 MHz) in the AFCI. This CCUCLK can further be divided down by a pre-scaler. The pre-scaler is implemented as a 10-bit free-running counter with programmable reload at overflow. The Timer is a free-running 16 bit up/down counter counting at the pace determined by the pre-scaler. It is programmed as an up counter in the AFCI.

Power companies maintain the line frequency to a very tight tolerance on the nominal 60Hz. This is used in the AFCI. A frequency measurement function with the CCU was developed for cases where the internal oscillator of the AFCI drifted or the nominal frequency was 50 Hz.

The CCU timer is a 16 bit counter which must count at least one cycle max; CCUCLK=$2^{16}$/20.0 msec=3.277 MHz. CCU pre-scaler=2, CCUCLK=3.0 MHz.

CCU clock=3.0 MHz=1/333.3 nsec
For 60 Hz:
1/60=16.67 msec=50,000 CCU clock counts/12=4167 counts per window
For 50 Hz:
1/50=20.00 msec=60,000 CCU clock counts/12=5001 counts per window Maximum clock counts=$2^{16}$=65,536.

The ADC interrupt times are computed (in clock counts) for each sample and stored in an array for use in the loop. These are not ADC interrupts but CCU Output Compare Interrupts. Eleven interrupt times are computed at 4167 count intervals and stored to load the compare registers during the loop. The initial sample, at the zero crossing interrupt is not measured, it should be near zero and will be multiplied by zero in the first step of the DFT.

g) I/O Ports

Some routines would require configured I/O Ports. They must be configured by software to one of four types on a pin-by-pin basis. These are quasi-bidirectional (standard 80051 port outputs), push-pull, open drain, and input-only. Ports will not work with incorrect configurations.

h) Start Infinite Loop

As in most embedded programs, an infinite loop is the basis of the program. The first action in the loop is to test the arc flag (DelclareArc) and the EndOfLifeFlag—optionally, this step could be placed at the end of the loop.

On Flag (DeclareArc)=true, branch to read the reset switch, details of this function are covered elsewhere.

On Flag (DeclareArc)=false, continue with main branch.

There are several ways the End-Of-LifeFlag can be set and they are discussed in the code block where they appear.

On EndOfLifeFlag=true, branch to a function that is an infinite loop, the only exit is to disconnect power from the AFCI.

On EndOfLifeFlag=false, continue with the main branch.

i) Wait to Start Each Pass

The program flow waits at the start of every loop for a global flag (the AC Line positive slope zero crossing) to change value.

At the beginning of each loop it is necessary to start the CCU timer. After completion of the loop described in the next paragraph, The CCU timer is stopped and set to zero.

Within the infinite loop is a C switch/case structure. There are 11 cases, each ending with and ADC measurement. The time interval of each case is fixed by the CCU interrupt. These cases are sometimes called cells. All calculations required to declare an arc and interrupt the AC line must be distributed among these cells. Some calculations require only the value of one measurement, these are made in the cell after the sample is acquired, resulting in a one-cell offset. Some calculations require all of the voltage and current samples, these arrays are valid, only during cell 0. Three calculations involve square roots and each take nearly the whole cell. Arc declaration requires two cells. Four cells were used for data output during development.

The ADC cannot respond to the CCU interrupt. The Capture Compare Unit (CCU) ISR responds and starts the ADC.

There are many special function registers (SFR) to set up the ADC. Many do not require programming. The A/D converter requires that its internal clock source be in the range of 500kHz to 3.3MHz to maintain accuracy. A programmable clock divider that divides the clock from 1 to 8 is provided for this purpose. The ADC is driven by CCLK not PCLK; CCLK=12.0 MHz; divisor=4, frequency=3.0 MHz. The ADC is configured to—Auto Scan, Single Conversion Mode, Start Immediately, and Interrupt Operation. The ADC interrupt signals that Sampling is complete. The periods between sample interrupts are called cells.

Each case ends with a wait for this interrupt. All computations are performed during these waits. Since the Data Sample is taken at the end of the loop, calculations must be for the preceding cell. Data from cell 10 is processed in cell 0. Cell 0 values are also set.

The code uses a switch/case structure with 11 cases. These cases are referred to as computational cells.

The DFT computations must be done for k=1 (fundamental), k=2 ($2^{nd}$ harmonic), and k=3 ($3^{rd}$ harmonic).

Cell 0 is zero because of the synchronization to the AC line. Cell 11 computations are performed in the next Cell 0. This provides needed computational time.

Cells 0 through 11 wait for the ADC sample, which ends the cell.

The timing for the ADC is provided by the Capture/Compare Unit (CCU) peripheral, which has many modes of operation. The AFCI uses only the basic timer and one output compare channel (A). The CCU counts for one AC line cycle and is zeroed at the end of the cycle.

The CCU times for the interrupts are computed at the beginning of the program and stored. At the beginning of each cell, this count is moved to the CCU compare register.

Only load current DATA is transformed to the frequency domain. Over the cycle the sum of the sample data multiplied by the appropriate basis function in each cell are computed for the Real and imaginary equations. A running sum is kept of the values. The negative sign on the imaginary component is handled later.

This calculation must occur after the data is sampled. Each cell computes the component for the sample taken in the preceding cell. Cell 0 uses the data from cell 11 of the preceding cycle and zeros Cell 0 data.

When all cells have been processed, the CCU timer is stopped and reset to zero.

The Test Switch is read at the end of each pass through the loop. This permits valid data to be read with test readouts. Depressing the Test Switch will result in DeclareArc being set, overriding all previous values computed. The flag to switch the trip solenoid, SwitchT1 is set equal to DeclarArc.

Figure 16:
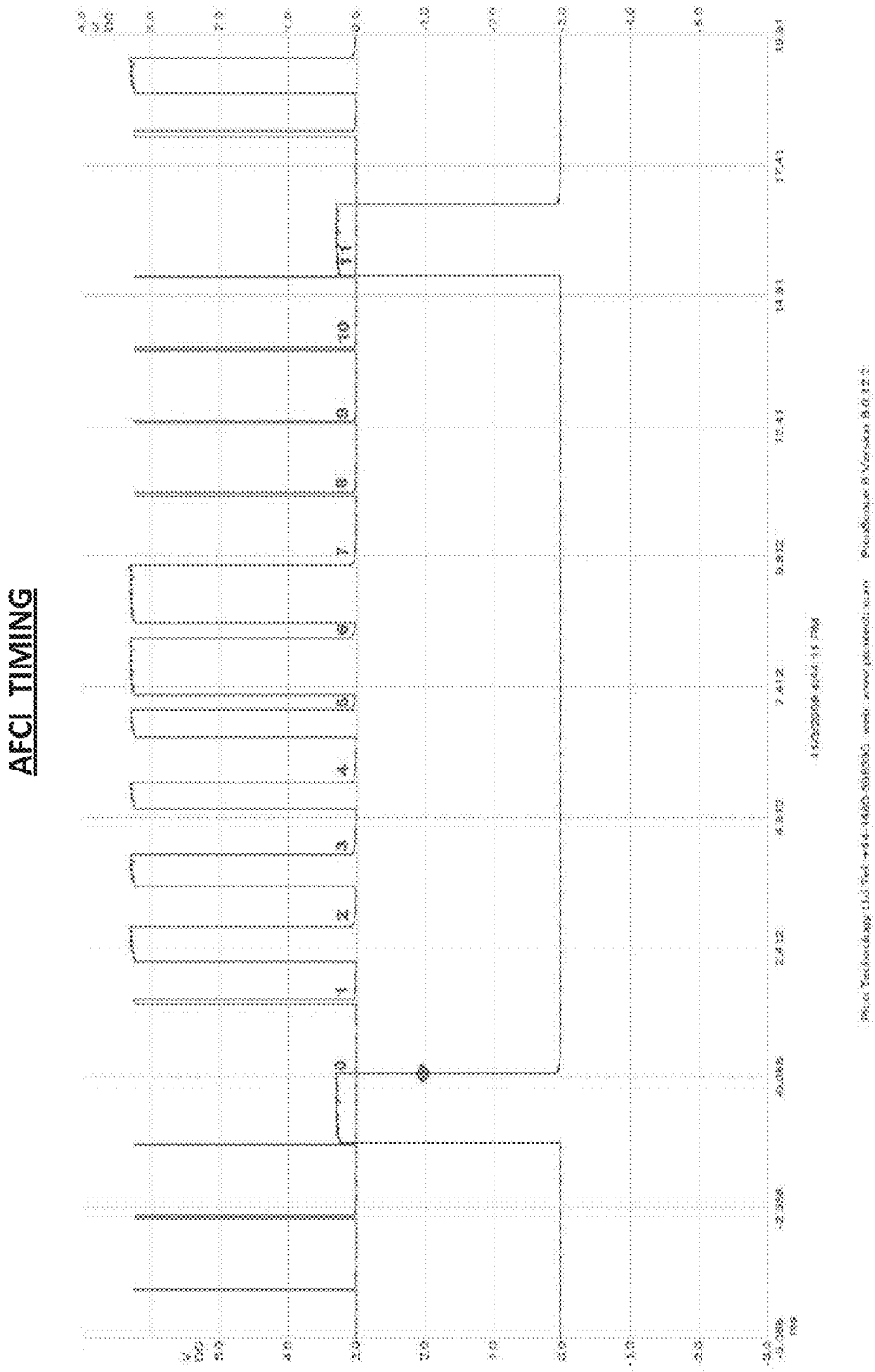
FIG. 16 is an AFCI timing diagram.

FIG. 16 illustrates the AFCI timing.

Two signals are shown in FIG. 16. The lower signal corresponds to the axis shown on the left. The upper signal corresponds to the axis shown on the right. The lower signal is the wait for the AC Line positive slope zero crossing global flag at the high value. The upper signal is the wait for the interrupt at the end of each cell. The high value is the wait. The development data display was on for this waveform; notice the very short waits on the last 4 interrupts caused by the long time required for output. Negative slopes correspond with the interrupt occurrences.

The computations of the second pass through the loop are described ignoring the computations of the first pass even though both sets occur for each pass through the loop.

In Cell 0

The imaginary partial result is negated and divided by 12. Gain is adjusted if allowed by the DoNotCompute flag. This function is described in detail later.

Sample data from the preceding cycle is cleared.

In Cell 1

The real partial result is divided by 12. The running sum variables are cleared; no data from this cycle has been added to them.

In Cell 2

The fundamental is computed from the results of previous partial calculations.

Further computation is blocked of fundamental values less than 1000.

In Cell 3

The second harmonic is computed from the results of previous partial calculations. The position of the contactor may be determined by measuring the output voltage because it is in the correct time slot for measurement.

In Cell 4

The third harmonic is computed from the results of previous partial calculations.

In Cell 5

ComputeArc is called where Thresholds are set, Arc is computed—1000× (3rd harmonic/fundamental). This is an arbitrary definition. Averages, maximum, and minimum of several variables are computed. The length of data may be determined by one variable for all computations.

In Cell 6

ComputeArcContinued is called where DeclareArcis set.

In Cell 7

This time slot is available for computations to satisfy other device functions

In Cell 8

This time slot is available for computations to satisfy other device functions

In Cell 9

This time slot is available for computations to satisfy other device functions

In Cell 10

This time slot is available for computations to satisfy other device functions j) Compute Arc Thresholds are set by observing arc detection; they are empirical values.
ArcThreshold=30.
MaxAveThreshold=13.
DeltaThreshold=15.
OverloadCountThreshold=10.
DimmerArcThreshold=30.

**Note: The above values are empirical and are used as basis on this disclosure, however, they are subject to adjustment to match future arc measurements, considerations and requirements, without departing from the basic principles and methods of this disclosure These values are placed in one location so they may easily be modified during testing. It is expected that these values will be changed several times during further testing and until they are fixed to satisfy all standard and code requirements.

Define an arc—Arc=(1000*VH [3])/VH [1]. Where VH [1] is the magnitude of the Hall Effect Current Sensor HES (1) output voltage fundamental harmonic. And VH [3] is the magnitude of the Hall Effect Current Sensor IC output voltage third harmonic.

Define: DeltaArc[s]=abs (Arcs[s]−Arcs [s0]);
Define: NoiseDC[s]=SignalDC;
Define: AveArc+=(int) Arcs[k]; average over 18 samples
Define: AveDeltaArc+=DeltaArc[k]; average over 18 samples
Define: AveNoiseDC+=NoiseDC[k]; average over 18 samples k) ComputeArcContinued Initially ComputeArc and ComputeArcContinued were one function. Averaging in ComputeArc increased computation time beyond the limit for one cell.

if (AveArc>ArcThreshold) DeclareArc=true;
if (Arc<AveArc) DeclareArc=false; This happens when a Dimmer is increasing over threshold after being below threshold.

Overload caused by a motor startup transient. The data for this calculation is not available in cell 6. It is available in cell 0, where AdjustGain is called, so overload calculations are performed there. If the current is greater than 95 (an arbitrary number depending on the rating of the AFCI), Overload is declared, and the overload counter incremented. In ComputeArcContinued, if OverloadCount is greater than its threshold of 10, DeclareArc is set; if it is less than threshold, declare arc is cleared—overriding arcs declared previously. A motor starting up may exceed the arc threshold ten times before DeclareArc is set. This threshold may be modified in further testing.

Some speed controls used on small motors (electric drills) produce all harmonics during the speed controlled portion of their ramp up. The presence of the 2nd harmonic detects this condition. If the 2nd harmonics is greater than ½ the 3rd harmonic, DeclareArc is cleared, overriding all previous arc declarations.

All motors arc when running. This is an example of a good arc. DeclareArc should not be set on a good arc. When the motor speed control is being ramped up there is a transition where the Speed control and its characteristic 2nd harmonic drop out and the motor is running with a high Arc value greater than 3 times the ArcThreshold (90 which is arbitrary). Arcs caused by fractures in conductors will be detected when they reach ArcThreshold (30 which is arbitrary). If AveArc is greater than three times ArcThreshold, DeclareArc is cleared, overriding any previous set.

The AC load current time domain waveform produced by a dimmer is different than one modified by an arc. The frequency domain signals are very similar. The computations are performed in AdjustGain because the data is available only in cell 0. The leading edge of the time domain signal decreases much faster for the dimmer than for and arc. DimmerArcRatio is defined as 100× cell 0 value/MaxSignal. If DimmerArcRatio is less than 30, DeclareArc is cleared, overriding any previous set.

GainUnStable is computed in cell 5. If Gain is not constant over the values averaged (16). GainUnStable is set and DeclareArc is cleared, overriding any previous set.

The Point Contact Arc Test is based on AC Load Voltage, not AC Load Current. Again, the computations are performed in AdjustGain because the data is available only in cell 0. The peak-to-peak voltage (Vpp) is computed from the sampled data. OldVpp is set equal to Vpp ahead of the Vpp calculation. If 100× Vpp/OldVpp is less than 80, DeclareArc is set.

The test switch is always read. If the switch is depressed then released, it will hold in a loop until it is released, then it will set DeclareArc, overriding any previous value.

l) Miswire

Miswire is covered in other embodiments of this disclosure. Refer to the partial schematic in FIG. 11. Contactor is used in short for the electromagnetic contactor as used in the other embodiments of this disclosure.

The Miswire Partial Schematic shows the relevant components and their interconnections extracted from the AFCI Schematic for clarity.

Miswire is a condition where the power supply line side wiring is connected to the load side, and the load side wiring connected to the line side of the device.

Use of the AFCI circuits to determine this condition requires that the active components receive power supply. A secondary AC rectifier bridge (X5) supplies the DC Power Supply to satisfy this requirement.

(U8) is an optocoupler used as test point to determine current flow from line side of the contactor to load. In addition to wiring, power is determined by the state of the

|  | Tripped | Reset |
|---|---|---|
| Not Miswired | Line | Line |
| Miswired | Open | Line | contactor, either reset or tripped. Tripped means the line and load side contacts are disengaged.

There are four combinations of the two determining conditions.

When the AFCI is not Miswired, power will flow through a reset contactor to the test point and not flow though a tripped contactor.

When the AFCI is Miswired, power will flow from the load side to the line side of the contactor and this is a test point whether the contactor is tripped or reset.

The table shows that the Miswire condition cannot be determined by measuring signal at this point if the AFCI is Reset. The first step in the procedure is to Trip the Microprocessor. A loop of setting the contactor and waiting for it to trip is iterated twice. If the AFCI is in the reset state and Miswired, power will be connected to the trip solenoid actuator via the output terminals to the input terminals, hence it will trip. When it is tripped, the output terminals to input terminals path is opened and the 2nd trip will time out.

If the AFCI is in the trip state and Miswired, power will not be connected to the trip solenoid actuator; Both iterations will time out and the contactor will not be switched. An AFCI which is initially bad will not trip, and reach this point in the flow. Flag as a Miswire and catch the problem in End-Of-Life after the Miswire is fixed.

If the wiring is correct, the AFCI will trip both times and NOT end in a time out and set Miswire.

A time out of the second iteration of this nested loop is a Miswire. DeclareArc will be set to use the existing program flow to read the reset switch, blink the green LED, and wait for the entry of a reset on the manual switch to issue a software reset to the AFCI program which flows to the start of the program.

If the Contactor is tripped and not Miswired, it must be reset for AFCI use. This is where the actual reset initiated by the reset switch happens. When the reset switch is read, and reset is indicated, the microprocessor is reset and on restart the program proceeds to this point before the contactor resets.

Measurement of contactor position for miswire is done after the peak of the AC line sine wave, where at this point, the contactor position has changed, and the contactor has changed position and signal voltage is existent or not on the load side according to the switching position.

A logic output optocoupler (U8) is used for measurement of this line to neutral signal. During the negative half cycle of the AC line sine wave, the optocoupled LED has no output.

Hardware timing with the Timer0 peripheral is used to determine the end of drive to the optocoupler which also drives the contactor silicone-controlled rectifier (SCR), and the time to measure its position. Times will require modification when the AC line frequency is other than 60 Hz. The hardware timing is more direct and easier to setup for automatic response to line frequency changes.

m) End-Of-Life

SwitchINT1 is set only in CheckContactorMiswire to reset the contactor after the Miswire tests. This is the reset caused after depressing the reset switch which causes the AFCI to turn off and then back on in the Miswire procedure. Since SwitchINT1 is set, the reset solenoid actuator will fire on the next positive slope zero crossing, independent of the number of line cycles between the two events.

SwitchINT1 will be cleared and ResetSwitchPending will be set.

SwitchT1 is set equal to DeclareArc at the end of the data sampling loop. SwitchT1 is set in CheckContactorMiswire to trip the contactor two times. SwitchT1 is set in EndOfLife to trip the contactor if it is capable of opening; no more processing required. There are no other instances of setting SwitchT1.

The test or reset buttons halt program flow when depressed. Upon release, program flow resumes and it recognizes that the buttons have been depressed.

When SwitchT1 is set, the contactor will switch on the next positive slope zero crossing of the line voltage. SwitchT1 will be cleared and TestSwitchPending is set.

TestSwitchPending is cleared in CheckContactorMiswire for those instances set there The normal and test mode of setting SwitchT1 is by setting DeclareArc at the end of the data sampling loop On the next positive slope zero crossing of the line voltage, (at the start of cell 0), the contactor will trip, SwitchT1 will be cleared, and TestSwitchPending will be set.

An EndOfLife test on the reset contactor, programmed into one of the prototypes does exhibit successful tests. Some EndOfLife test will be developed. These test the contactor contacts and solenoid actuators.

Timing of the Line crossing and ADC sample interrupts will be developed. Failure flows to EndOfLife.

A 5-year life limit will indicate EndOfLife.

n) Solenoid Actuator Failure to Constitute End-of-Life

When Timer0 overflows, the AC Line voltage will be at its peak (or any arbitrary position). A logic output optocoupler U8 connected to the Load Output will read 1 when signal is present and 0 when no signal is present. There are several reasons why no signal is present.

If the ContractorState says it should be reset and it reads trip, the EndOfLife Flag will be set. Likewise if the ContractorState says it should be tripped and it reads reset, the EndOfLifeFlag will be set.

The EndOfLifeFlag is tested at the start of each pass through the loop.

o) AdjustGain

This function is called from cell 0 where all sampled data is valid (for the preceding AC line cycle). All functions that require access to this data are computed in this function. Reorganization into a more structured system may occur in the future.

Store the preceding value of peak to peak line voltage (OldVpp). Compute the current value of peak to peak line voltage (Vpp). The only use of these values is in the point contact arc test.

The output voltage of the Hall Effect Current Sensor IC is sampled with the microprocessor peripheral analog to digital converter (ADC). This signal is amplified in a programmable Gain Amplifier before being applied to the ADC. The digital value is converted to AC by subtracting the measured mean value. This signal is VC [12].

The maximum of the absolute VC [12] values is found and called MaxSignal.

The sum of the VC [12] values is found and called SignalDC—the zero term sinusoid.

The sum of the absolute VC [12] values is found and called AveSignal.

The Overload flag is set if MaxSignal is greater than 95 (which is an arbitrary value). OverloadCount is incremented on each cycle where Overload is set. When a value of MaxSignal less than 95 is encountered, Overload is cleared and OverloadCount zeroed.

Auto Ranging:

The object of this auto ranging is to provide an optimum signal for the ADC's range.

Gain is modified (or not changed) based on signal level

If MaxSignal is less than 40, Gain is doubled.

If MaxSignal is greater than 95, Gain is halved.

If Gain is greater than 128, set Gain to 128. (150 W load produces Gain of 8).

If Gain is less than one, set Gain to 1

Determine programmable gain amplifier (PGA) unique gain control values and program the device. Each gain of the PGA provides a range of values to the ADC. By modifying the gain value based on signal level and programming the PGA to this value, auto-ranging is provided.

Two devices have been considered. The same algorithm to convert calculated gain to device programming is used for both.

Analog Devices (AD) Zero Drift, Digitally Programmable Instrumentation Amplifier AD8231 is a low drift, rail-to-rail, instrumentation amplifier with software-programmable gains of 1×, 2×, 4×, 8×, 16×, 32×, 64×, or 128×. The gains are programmed via digital logic. The gain control pins are A2 (MSB), A1, and A0 (LSB). A switch/case structure is used to convert Gain to A2 . . . A0 values. The corresponding µP output pins are set to these values.

The P89LPC9351/9361 are new microprocessors that are pin compatible with the NXP P89LPC935/936 and have more peripheral devices including a PGA. The gain control pins are in the PGA control register, which is an expanded special function register (SFR). The programming for these pins is selected by the same switch/case structure as the AD8231. When development tools are available these devices may replace the P89LPC935/936 and AD8231 in the AFCI.

p) Contactor Switching

There are two solenoid actuators in the switching contactor, Test (or Trip) and Reset. These solenoid actuators are driven in interrupt service routines synchronous with the positive slope zero crossing of the AC line. Flags are set in the main routine to determine if a solenoid actuator should be switched when the zero crossing occurs.

Analog Converter 1 (AnC1) is driven (with positive feedback hysteresis) with the attenuated, delayed, and DC translated AC Line voltage. It generates an interrupt on switching. Comparator input signals are designed such that this interrupt occurs on the zero crossing. The comparator status word contains information on its slope.

Negative slopes are ignored by returning from interrupt immediately. On positive slopes the solenoid actuator switching flags branch to their respective routines. Most of the time neither flag will be set and they will never be set simultaneously. The comparator reference is provided by the microprocessor peripheral DAC1. Adjusting the reference voltage adjusts the phase difference of the current and voltage signals.

The routines for Test and Reset are identical except for the different solenoid actuators being driven for their respective flags. If the flag is set, the solenoid actuator will be turned on, Timer0 set to generate an after the solenoid has switched and Timer 0 is started. The timer is then read in a loop until it high byte >=AC (582 µsec); the solenoid actuator drive is then removed.

Flags are cleared and ContractorState set per the switching performed, and the Interrupt service routine returns from interrupt with Timer0 still running. The position will be read in the Timer0_ISR when its interrupt occurs.

As an option for the devices of this disclosure, on operation of Test button, an arc value above the arc threshold is introduced into the data processing routine, enters the infinite loop, becomes interpreted as an arc and thereby go through the DECLAREARC routine to trip the contactor and isolate the line from the load side of the devices herein.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. An apparatus to detect electrical circuit faults comprising: a microprocessor driven electronic circuit, said microprocessor being programed with software code to completely manage said electronic circuit, said microprocessor driven electronic circuit has a current sensor that is a power-driven and is a bi-directional Hall Effect Current Sensor Integrated Circuit comprising a Hall Current Drive with dynamic offset cancellation, gain and temperature coefficient adjustment, amplifiers, zero "0" current adjustment, analog and digital outputs, analog to digital converter, a ratio metric output voltage proportional to the current flow, stable output offset voltage and nearly zero magnetic hysteresis, said software code managed electronic circuit continuously monitoring a single or multi-phase AC, or DC, electrical circuit for fault conditions including series and parallel arcs, overcurrent, overload, short circuit, miswire, and end-of-life conditions, and said software code managed electronic circuit limiting the occurrence of nuisance tripping conditions while monitoring said electrical circuit for said faults, said microprocessor driven electronic circuit being assembled in a housing, said electronic circuit having line and load side terminals, said electronic circuit having an electromagnetic actuated circuit tripping contactor, a reset button, a test button, electronic circuit status visual indicators, electronic circuit fault detection audible indicators, and upon said code managed microprocessor driven electronic circuit's detecting that one or more of said fault conditions exist, said code managed microprocessor driven electronic circuit then activates the electromagnetic contactor to trip open the electrical circuit and thereby isolate the monitored electrical circuit line and load connections.

2. The apparatus of claim 1, wherein the occurrence of nuisance tripping is limited through the implementation of algorithm-based code routines and selection of circuit components that filter noise and condition the line signal to insure accurate determination of real arcs and distinguish between real arcs from normal electrical load signatures that mimics that of an arc.

3. The apparatus of claim 1, wherein the detection of overload, overcurrent, and short circuit conditions are accomplished by algorithm-based code routines, comparing the output of the current sensor with established thresholds.

4. The apparatus of claim 1, wherein the housing is configured for electrical receptacles, receptacle outlets, circuit breakers, circuit switches, and electrical cords.

5. The apparatus of claim 1, wherein the electromagnetic contactor comprises a trip and reset mechanism using separate solenoid actuators which are independently driven by the trip and reset switching circuits through optically-coupled triacs or optocouplers.

6. The apparatus of claim 1, wherein the reset mechanism is manually-operated and the trip mechanism is solenoid-actuated through hardware and microprocessor code routines.

7. The apparatus of claim 1, wherein the electromagnetic contactor uses a single-solenoid actuator with reversible motion for trip and reset operations through hardware and microprocessor code routines, the reversibility being accomplished by alternately triggering the actuator in either the positive or negative slopes of the AC power supply signal.

8. The apparatus of claim 1, wherein the electromagnetic contactor utilizes a linear, single-motion, single-coil, solenoid actuator for its trip and reset functions by reversing positions with every stroke corresponding to a tripped or reset position through an integrated mechanical locking and displacement assembly.

9. The apparatus of claim 1, wherein the visual and audible indicators are used to annunciate device functions and conditions that include power on, fault condition, and the type of faults that occur including arc, overload, short circuit, miswire, and end-of-life.

10. The apparatus of claim 1, wherein the electronic circuit adopts to 60 hz and other fundamental frequencies by having the hardware timing configured for automatic response to line frequency changes determined through microprocessor code routines.

11. The apparatus of claim 1, wherein the output signals of said current sensor are conditioned by the anti-alias filter, buffer amplifier, and programmable gain amplifier for analysis and processing for detection of electrical faults including the presence of arcs by observing them in both the time and frequency domains.

12. The apparatus of claim 11, wherein a 4-pole butterworth filter is used as an anti-alias filter to prevent aliasing of sampled data and to remove noise in the signal.

13. The apparatus of claim 11, wherein the anti-alias filter causes a phase shift between the voltage signal to the Analog Comparator and the current signal to the Analog to Digital converter (ADC) where the variable threshold provided by the Digital to Analog Converter (DAC) for the analog comparator reference and capacitive elements added to the resistive divider compensate for the said phase shift, the digital to analog converter (DAC) reference signal being set as the high signal limit which is the power supply voltage of the microprocessor.

14. The apparatus of claim 11, wherein the programmable gain amplifier, being a low-drift instrumentation amplifier, maintains the amplitude of the output signal of the Hall Effect Current Sensor Integrated Circuit by auto-ranging or modifying the gain value based on signal levels within a range suitable for analog to digital conversion for the detection of arc and other electrical faults, connecting the low input to the low output and to the DC offset voltage allowing the AC component of the output signal from the Hall Effect Current Sensor Integrated Circuit to be amplified with variable gain while the DC component receives a constant gain.

15. The apparatus of claim 11, wherein the programmable gain amplifier is a microprocessor peripheral.

16. The apparatus of claim 11, wherein a buffer amplifier is used for attenuation and offset of the Hall Effect Current Sensor Integrated Circuit output, and provides the sampling reference and synchronization of the line signal to the output signal of the Hall Effect Current Sensor Integrated Circuit.

17. The apparatus of claim 11, wherein a resistive divider is used to attenuate and DC shift the line voltage at the output of the Current Sensor to match the input limits of the buffer amplifier which provides the reference signal to the analog comparator for positive feedback hysteresis to increase the slope of the reference at the instant of switching and thereby produce a more accurate synchronization of sampling to the AC line voltage.

18. The apparatus of claim 11, wherein the microprocessor comprises the peripherals to generate and process signals received from the Current Sensor and the power line, implement analog to digital data conversion, digital to analog data conversion, data comparison, switching and signaling functions to continuously monitor load conditions, and activate the switching and tripping mechanisms, the visual and audible indicators.

19. The apparatus of claim 1, wherein the microprocessor driven electronic circuit has a power supply that is a switch-mode-power-supply circuit operating at a defined range of input AC voltages with stable DC output to the power-driven components of the apparatus, same comprising an input rectifier and filter, a controller, a high frequency transformer, an output rectifier and filter, and integrated circuit power switcher.

20. The apparatus of claim 19, wherein the power supply circuit is linear.

21. The apparatus of claim 19, wherein the power supply circuit consists of two similar bridge rectifiers connected in parallel on the line and load sides of the electrical circuit to ensure uninterrupted power supply to the electrical circuit when a miswire fault condition occurs.

22. The apparatus of claim 21, wherein the power supply is a part of the apparatus' miswire protection circuitry.

23. The apparatus of claim 1, wherein the microprocessor is configured with a set of peripherals to perform sampling to support and generate the timing signal required for coherent Direct Fourier Transforms, use their properties to compute and detect arcs, and disengage the contacts when an arc occurs.

24. The apparatus of claim 1, wherein the electromagnetic contactor has a position sensing circuit connected on the load side of the electrical circuit and said sensing circuit determines the contactor position for miswire condition after the peak of the AC line sine wave where the contactor position changes and signal voltage on the load side is either existent or non-existent, according to the contactor position.

25. The apparatus of claim 1, wherein the microprocessor driven electronic circuit electrical circuit miswire fault monitoring protection circuitry utilizes an optocoupler as a test point to determine current flow from the electrical circuit line side of the electromagnetic contactor to the load side of the electrical circuit to detect a miswire condition and then feed back the signal to the microprocessor to initiate code routines to activate the visual indicators, audible indicator, and the electromagnetic contactor trip mechanism.

26. The apparatus of claim 1, wherein the microprocessor driven electronic circuit monitoring of end-of-life fault conditions are defined in its software code and determined through a series of routines and hardware test points as that condition when the apparatus is no longer able to perform its designed functions or unsafe to continue operation, or when the end of a pre-set time or cumulative operation time is reached as determined through a clock or time counter within the microprocessor, or the reset mechanism is unable to engage contacts between the line and load, or the test or trip mechanism is unable to disengage contacts between the line and load, or failure of a code routine to execute routines, the end-of-life being declared after the reset button is pressed but no longer able to reset the contacts.

27. The apparatus of claim 1, wherein the software code uses an infinite loop that starts only after the reset button is pressed to ensure accurate timing of the electromagnetic contactor opening and closing operations.

28. The apparatus of claim 1, wherein the test button sets the software code routine for a ARC DECLARE flag and introduces an arc value above the arc threshold into the data processing routine, enter the infinite loop and becomes interpreted as an arc and thereby go to the DECLAREARC routine to trip the contactor and isolate the line from the load side of the apparatus.

29. The apparatus of claim 1, wherein in the microprocessor's software code the DeclareArc Flag is set upon decoding the switch and cannot be cleared by anything other than the reset button, the microprocessor reset function being inactive on end-of-life fault conditions including miswire fault.

30. The apparatus of claim 1, wherein in the microprocessor's software code an infinite loop is the basis of the code which includes synchronization of sampling to AC line voltage, the electromagnetic contactor solenoid actuator switching, compute arc, miswire, end-of-life, compute gain, adjust gain, and declare arc; the first action in the loop being TestArc flag, or DeclareArc Flag, or EndofLife flag, which alternatively could be in the end of the loop.

31. The apparatus of claim 1, wherein in the microprocessor's software code the ratio of the amplitude of the $3^{rd}$ harmonic to the amplitude of the 2nd harmonic line signal multiplied by an arbitrary number is set as threshold for determining the occurrence of arcs which sets or clears the DeclareArc flag in the code routine.

32. The apparatus of claim 1, wherein the microprocessor driven electronic circuit's synchronization of sampling to the AC line voltage is the basis for all its operations, where ADC sampling is on both the electrical circuit's line current and line voltage sensor's signals.

33. The apparatus of claim 1, wherein in the microprocessor's software code a coherent Direct Fourier Transform (DFT) is used for processing sampled data including the DC ($0^{th}$ harmonic), $2^{nd}$ and $3^{rd}$ harmonics in the detection of arcs, making possible the use of low-cost microprocessors and ensuring there is no spill-over between the frequency bins, thereby eliminating the need for windowing.

34. The apparatus of claim 1, wherein in the microprocessor's software code the analog comparator interrupt service routine (ISR) differentiates between positive and negative slope zero-crossings where the main function is synchronized to the AC line positive slope zero-crossing provided by a variable which is set in the ISR to signal the main routine when this occurs, the analog comparator ISR driving the contactor solenoid switches when the appropriate flag is set to ensure that switching occurs at zero voltage to enhance the life of the electromagnetic contactor.

35. The apparatus of claim 1, wherein said software code managed electronic circuit also continuously monitors the electrical circuit for ground faults, and when a ground fault condition exists, said code managed microprocessor driven electronic circuit then activates the visual and audible indicators and the electromagnetic contactor to trip open the electrical circuit and thereby isolate the monitored electrical circuit line and load connections.

36. A method to detect electrical circuit faults comprising: having a microprocessor driven electronic circuit, said microprocessor being programed with software code to completely manage said electronic circuit, said microprocessor driven electronic circuit has a current sensor that is a power-driven and is a bi-directional Hall Effect Current Sensor Integrated Circuit comprising a Hall Current Drive with dynamic offset cancellation, gain and temperature coefficient adjustment, amplifiers, zero "0" current adjustment, analog and digital outputs, analog to digital converter, a ratio metric output voltage proportional to the current flow, stable output offset voltage and nearly zero magnetic hysteresis, said software code managed electronic circuit continuously monitoring a single or multi-phase AC, or DC, electrical circuit for fault conditions including series and parallel arcs, overcurrent, overload, short circuit, miswire, and end-of-life conditions, and said software code managed electronic circuit limiting the occurrence of nuisance tripping conditions while monitoring said electrical circuit for said faults, said microprocessor driven electronic circuit being assembled in a housing, said electronic circuit having line and load side terminals, said electronic circuit having an electromagnetic actuated circuit tripping contactor, a reset button, a test button, electronic circuit status visual indicators, electronic circuit fault detection audible indicators, and upon said code managed microprocessor driven electronic circuit's detecting that one or more of said fault conditions exist, said code managed microprocessor driven electronic circuit then activates the electromagnetic contactor to trip open the electrical circuit and thereby isolate the monitored electrical circuit line and load connections.

* * * * *